US012666730B2

(12) United States Patent
Chung et al.

(10) Patent No.: US 12,666,730 B2
(45) Date of Patent: Jun. 23, 2026

(54) STACKED CMOS IMAGE SENSOR AND METHOD OF MANUFACTURING THE SAME

(71) Applicant: Taiwan Semiconductor Manufacturing Company, Ltd., Hsinchu (TW)

(72) Inventors: Chi-Hsien Chung, New Taipei City (TW); Tzu-Jui Wang, Fengshan City (TW); Chen-Jong Wang, Hsin-Chu (TW); Tzu-Hsuan Hsu, Kaohsiung City (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 706 days.

(21) Appl. No.: 17/887,634

(22) Filed: Aug. 15, 2022

(65) Prior Publication Data

US 2023/0411431 A1     Dec. 21, 2023

Related U.S. Application Data

(60) Provisional application No. 63/342,659, filed on May 17, 2022.

(51) Int. Cl.
H10F 39/18          (2025.01)
H10F 39/00          (2025.01)

(52) U.S. Cl.
CPC ........... H10F 39/18 (2025.01); H10F 39/014 (2025.01); H10F 39/8037 (2025.01); H10F 39/811 (2025.01)

(58) Field of Classification Search
CPC .... H10F 39/18; H10F 39/014; H10F 39/8037; H10F 39/811; H10F 39/809; H01L 23/481; H01L 2224/06181
See application file for complete search history.

(56) References Cited

U.S. PATENT DOCUMENTS 8,629,524 B2     1/2014  Wang et al.
8,957,358 B2     2/2015  Wan et al.
(Continued)

OTHER PUBLICATIONS

Lim, Sung Kyu. "TSV-Aware 3D Physical Design Tool Needs for Faster Mainstream Acceptance of 3D ICs" ACM DAC Knowledge Center (dac.com), published in 2010.
(Continued)

*Primary Examiner* — Jacob Y Choi
*Assistant Examiner* — Aaron Michael Wegner
(74) *Attorney, Agent, or Firm* — Eschweiler & Potashnik, LLC

(57)          ABSTRACT

Various embodiments of the present disclosure are directed towards a stacked complementary metal-oxide semiconductor (CMOS) image sensor with a high full well capacity (FWC). A first integrated circuit (IC) chip and a second IC chip are stacked with each other. The first IC chip comprises a first semiconductor substrate, and the second IC chip comprises a second semiconductor substrate. A pixel sensor is in and spans the first and second IC chips. The pixel sensor comprises a transfer transistor and a pinned photodiode adjoining the transfer transistor at the first semiconductor substrate, and further comprises a plurality of additional transistors (e.g., a reset transistor, a source-follower transistor, etc.) at the second semiconductor substrate. A bulk of the first semiconductor substrate and a bulk of the second semiconductor substrate are electrically isolated from each other and are configured to be biased with different voltages (e.g., a negative voltage and ground).

20 Claims, 33 Drawing Sheets

(56) References Cited

U.S. PATENT DOCUMENTS

| | | | | |
|---|---|---|---|---|
| 9,136,302 | B2 | 9/2015 | Wang et al. | |
| 9,881,949 | B2 | 1/2018 | Liu et al. | |
| 10,090,349 | B2 | 10/2018 | Wan et al. | |
| 10,101,295 | B2 | 10/2018 | Chang et al. | |
| 10,129,487 | B2 | 11/2018 | Ayers et al. | |
| 11,177,434 | B2 | 11/2021 | Yu et al. | |
| 11,953,720 | B2 | 4/2024 | Cho et al. | |
| 2006/0125038 | A1 | 6/2006 | Mabuchi | |
| 2007/0029463 | A1* | 2/2007 | Park | H10F 39/014 |
| | | | | 250/214.1 |
| 2009/0185060 | A1* | 7/2009 | Akiyama | H10F 39/026 |
| | | | | 257/E31.11 |
| 2011/0141333 | A1 | 6/2011 | Naruse et al. | |
| 2014/0263959 | A1* | 9/2014 | Hsu | H10F 39/014 |
| | | | | 250/206 |
| 2015/0115332 | A1 | 4/2015 | Hynecek et al. | |
| 2016/0020235 | A1* | 1/2016 | Yamashita | H10F 39/811 |
| | | | | 250/206 |
| 2016/0249002 | A1* | 8/2016 | Kim | H10F 39/8037 |
| 2016/0254305 | A1 | 9/2016 | Sakano et al. | |
| 2017/0053957 | A1 | 2/2017 | Ueno et al. | |
| 2018/0261641 | A1 | 9/2018 | Maruyama et al. | |
| 2019/0123088 | A1* | 4/2019 | Kwon | H10F 39/802 |
| 2020/0388657 | A1 | 12/2020 | Huang | |
| 2021/0084249 | A1* | 3/2021 | Nakazawa | H04N 25/79 |
| 2022/0271070 | A1 | 8/2022 | Nakazawa et al. | |
| 2022/0336514 | A1* | 10/2022 | Lim | H10F 39/807 |
| 2022/0384493 | A1* | 12/2022 | Takatsuka | H10F 39/8033 |
| 2023/0262362 | A1 | 8/2023 | Kitano | |
| 2023/0411431 | A1 | 12/2023 | Chung et al. | |
| 2024/0170515 | A1 | 5/2024 | Ohba et al. | |
| 2024/0170518 | A1 | 5/2024 | Takatsuka | |

OTHER PUBLICATIONS

Anemoi Software. "Building a Dense 3DIC System: Power Challenges 3D." 3D In-Depth, Design, published on Sep. 28, 2022.
Fossum et al. "A Review of the Pinned Photodiode for CCD and CMOS Image Sensors" (2014). Dartmouth Scholarship. 2423, published May 2014.
Yu et al. "14nm FinFET process technology platform for over 100M pixel density and ultra low power 3D Stack CMOS Image Sensor" 2019 IEEE International Electron Devices Meeting (IEDM), published on Feb. 13, 2020.
Lee et al. "A Low-Voltage 0.7 um Pixel with 6000 e-Full-Well Capacity for a Low-Power CMOS Image Sensor" IS&T International Symposium on Electronic Imaging 2021, Imaging Sensors and Systems 2021, published on Jan. 2021.
Jung et al. "A 1/1.57-inch 50Mpixel CMOS Image Sensor with 1.0μm All-Directional Dual Pixel by 0.5μm-Pitch Full-Depth Deep-Trench Isolation Technology" ISSCC 2022 / Session 5 / Imagers, Range Sensors and Displays / 5.5, published on Feb. 21, 2022.
Liu et al. "A 1.5V 33Mpixel 3D-Stacked CMOS Image Sensor with Negative Substrate Bias" ISSCC 2016 / Session 6 / Image Sensors / 6.8, published on Feb. 1, 2016.
Liu et al. "A 1.5V 33Mpixel 3D-Stacked CMOS Image Sensor with Negative Substrate Bias" IEEE International Solid-State Circuits Conference, published in 2016.
"TSMC-SoIC X Chip-on Wafer" The date of publication is unknown. Retreived online on May 19, 2025 from https://3dfabric.tsmc.com/english/dedicatedFoundry/technology/SolC.htm.
U.S. Appl. No. 19/211,861, filed May 19, 2025.

* cited by examiner 302          1100

104a

104b 102     108          102     108          102     108          102     108

1200

$C_1$          $C_2$          $C_3$          $C_N$

102          $R_1$ $R_2$

102          $R_3$

A          A'   $R_M$ 102          102

3400

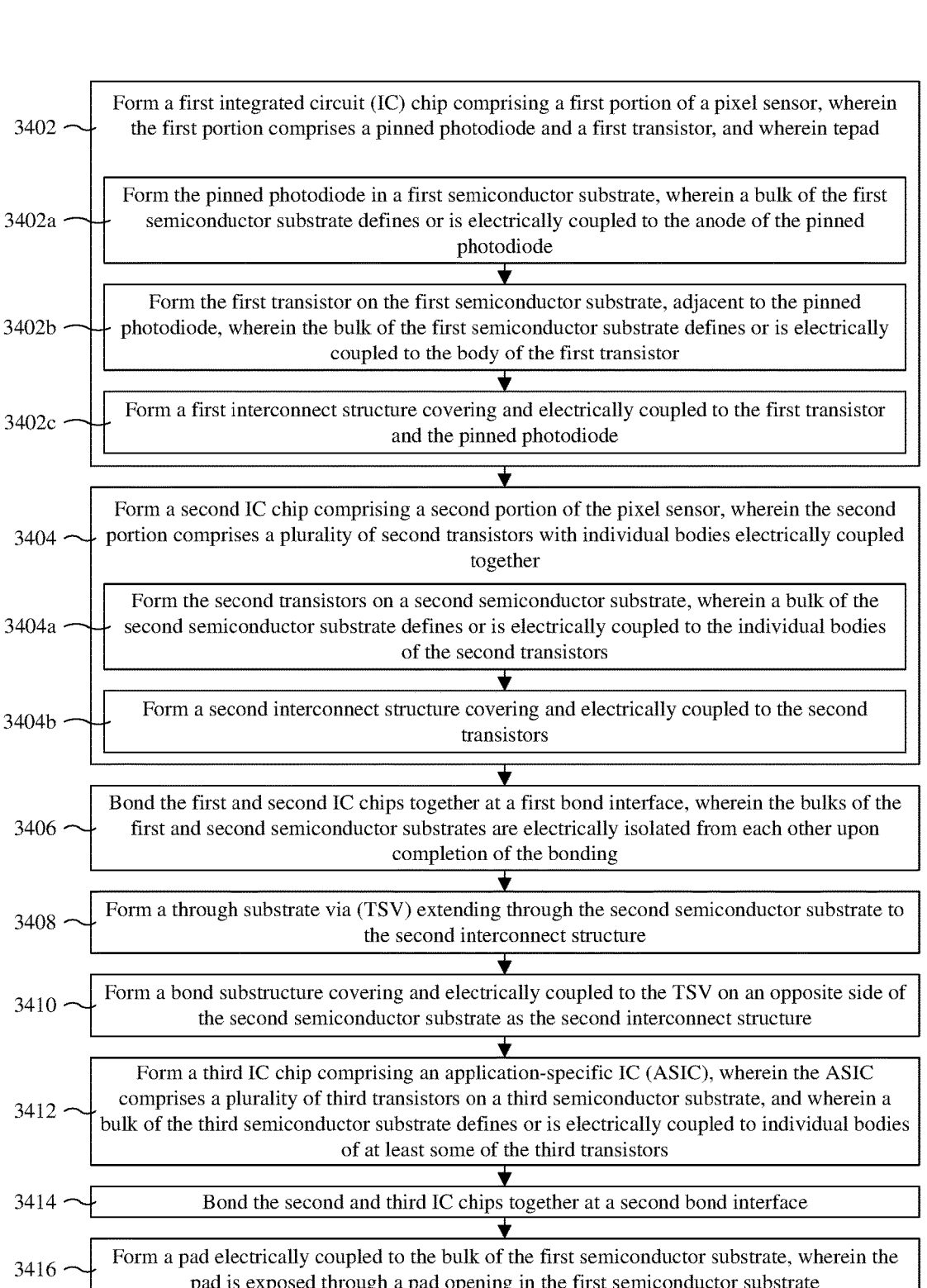

3402 — Form a first integrated circuit (IC) chip comprising a first portion of a pixel sensor, wherein the first portion comprises a pinned photodiode and a first transistor, and wherein tepad 3402a — Form the pinned photodiode in a first semiconductor substrate, wherein a bulk of the first semiconductor substrate defines or is electrically coupled to the anode of the pinned photodiode 3402b — Form the first transistor on the first semiconductor substrate, adjacent to the pinned photodiode, wherein the bulk of the first semiconductor substrate defines or is electrically coupled to the body of the first transistor 3402c — Form a first interconnect structure covering and electrically coupled to the first transistor and the pinned photodiode 3404 — Form a second IC chip comprising a second portion of the pixel sensor, wherein the second portion comprises a plurality of second transistors with individual bodies electrically coupled together 3404a — Form the second transistors on a second semiconductor substrate, wherein a bulk of the second semiconductor substrate defines or is electrically coupled to the individual bodies of the second transistors 3404b — Form a second interconnect structure covering and electrically coupled to the second transistors 3406 — Bond the first and second IC chips together at a first bond interface, wherein the bulks of the first and second semiconductor substrates are electrically isolated from each other upon completion of the bonding 3408 — Form a through substrate via (TSV) extending through the second semiconductor substrate to the second interconnect structure 3410 — Form a bond substructure covering and electrically coupled to the TSV on an opposite side of the second semiconductor substrate as the second interconnect structure 3412 — Form a third IC chip comprising an application-specific IC (ASIC), wherein the ASIC comprises a plurality of third transistors on a third semiconductor substrate, and wherein a bulk of the third semiconductor substrate defines or is electrically coupled to individual bodies of at least some of the third transistors 3414 — Bond the second and third IC chips together at a second bond interface 3416 — Form a pad electrically coupled to the bulk of the first semiconductor substrate, wherein the pad is exposed through a pad opening in the first semiconductor substrate

Fig. 34

STACKED CMOS IMAGE SENSOR AND METHOD OF MANUFACTURING THE SAME

REFERENCE TO RELATED APPLICATION

This Application claims the benefit of U.S. Provisional Application No. 63/342,659, filed on May 17, 2022, the contents of which are incorporated by reference in their entirety.

BACKGROUND

Integrated circuits (ICs) with image sensors are used in a wide range of modern-day electronic devices, such as, for example, cameras, cell phones, and the like. Types of image sensors include, for example, complementary metal-oxide semiconductor (CMOS) image sensors and charge-coupled device (CCD) image sensors. Compared to CCD image sensors, CMOS image sensors are increasingly favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 34 illustrates a block diagram of some embodiments of the method of FIGS. 22, 23A, 23B, 24, 25, 26A, 26B, 27A, 27B, 28-30, 31A, 31B, 32A, 32B, and 33.

DETAILED DESCRIPTION

Figure 1:
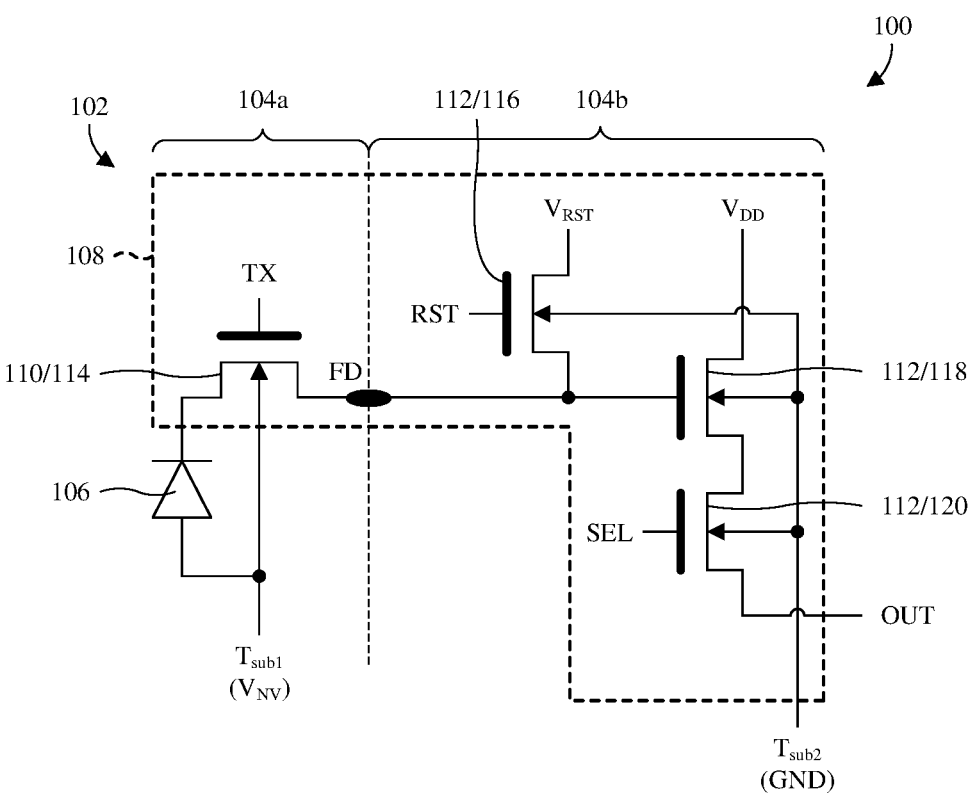
FIG. 1 illustrates a circuit diagram of some embodiments of a stacked complementary metal-oxide semiconductor (CMOS) image sensor with high full well capacity (FWC).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A stacked complementary metal-oxide semiconductor (CMOS) image sensor may comprise a first integrated circuit (IC) chip and a second IC chip that are stacked. The first IC chip accommodates a pixel sensor that repeats in a grid pattern, and the second IC chip accommodates an application-specific IC (ASIC) that is electrically coupled to the pixel sensor at each repetition of the pixel sensor. The pixel sensor comprises a pinned photodetector and a pixel circuit that are localized to the first IC chip. The pinned photodiode is configured to accumulate charge in response to incident radiation. The pixel circuit is configured to facilitate readout of the accumulated charge and comprises a plurality of transistors.

The plurality of transistors comprises a transfer transistor, a reset transistor, and a source-follower transistor. The transfer transistor is configured to transfer the accumulated charge from the pinned photodiode to a floating diffusion (FD) node. The reset transistor is configured to reset the FD node to a reset voltage, and is further configured to reset the pinned photodiode to a pinning voltage. The source follower transistor is configured to non-destructively buffer and amplify charge at the FD node.

The semiconductor manufacturing industry continuously seeks to scale down image sensors to achieve lower fabrication costs, higher device integration density, higher speeds, better performance, and so on. However, continuing to scale down the transistors of the pixel circuit has proven challenging, whereby the photodetector may instead be scaled down and hence performance of the pixel sensor may be degraded. For example, a full well capacity (FWC) may be degraded. The FWC is proportional to the size of the photodetector and corresponds to the maximum charge a pixel can hold before saturation, which results in signal degradation.

An approach to increase the FWC to compensate for smaller pixel sizes is to increase the FD reset voltage and the turn-on voltage of the transfer transistor. The former increases the pinning voltage of the pinned photodiode and hence increases the FWC of the pinned photodiode. However, the approach may cause reliability issues with the source-follower transistor and the reset transistor due to exposure of the source-follower transistor and the reset transistor to higher voltages. Further, the approach may depend on a higher supply voltage to the source-follower transistor, which may increase power consumption during readout.

Various embodiments of the present disclosure are directed towards a stacked CMOS image sensor with a high FWC. A first IC chip and a second IC chip are stacked with each other. The first IC chip comprises a first semiconductor substrate, and the second IC chip comprises a second semiconductor substrate. A pixel sensor is in and spans the first and second IC chips. The pixel sensor comprises a transfer transistor and a pinned photodiode adjoining the transfer transistor at the first semiconductor substrate, and further comprises a plurality of additional transistors (e.g., a reset transistor, a source-follower transistor, etc.) at the second semiconductor substrate. A bulk of the first semiconductor substrate and a bulk of the second semiconductor substrate are electrically isolated from each other and are configured to be biased with different voltages (e.g., a negative voltage and ground). The bulk of the first semiconductor substrate defines or is electrically coupled (e.g., shorted) to a body of the transfer transistor and an anode of the pinned photodiode. The bulk of the second semiconductor substrate defines or is electrically coupled (e.g., shorted) to individual bodies of the additional transistors.

Because the bulks of the first and second semiconductor substrates are electrically isolated from each other and configured to be biased with different voltages, the bulk of the first semiconductor substrate may be biased with a negative voltage and the bulk of the second semiconductor substrate may grounded (e.g., biased with a voltage of zero). As a result, voltages of the pinned photodiode and the transfer transistor, including the pinning voltage of the pinned photodiode and the turn-on voltage of the transfer transistor, are relative to the negative voltage rather than ground. This has the effect of increasing these voltages by a magnitude of the negative voltage, which increases the FWC of the pinned photodetector.

Because voltages of the additional transistors are relative to ground rather than the negative voltage, the additional transistors are not subjected to the higher voltages that the pinned photodiode and the transfer transistor are subjected to. As a result, endurance and reliability of the additional transistors is not impacted. Further, the source-follower transistor does not depend on a higher supply voltage, whereby power consumption is not impacted.

Because the pixel sensor is spread across the first and second IC chips, the pixel sensor has fewer transistors at the first IC chip than it would otherwise have. This allows the pixel sensor to be scaled down at the first IC chip without scaling down the pinned photodiode. Because the pinned photodiode is relatively large and is at the first IC chip, but not at the second IC chip, the portion of the pixel sensor at the first IC chip may be what limits scaling down of the pixel sensor. Hence, the portion of the pixel sensor at the second IC chip may have unused space. This unused space may be used for additional functionality. Additionally, scaling down the pixel sensor at the first IC chip may have the effect of scaling down the entire pixel sensor. Because the pixel sensor may be scaled down without scaling down the pinned photodiode, as described above, performance of the pixel sensor may be high even at small sizes.

With reference to FIG. 1, a circuit diagram 100 of some embodiments of a stacked CMOS image sensor comprising a pixel sensor 102 is provided. The pixel sensor 102 spans a first IC chip 104a and a second IC chip 104b that are stacked. The first and second IC chips 104a, 104b are shown as being laterally stacked, but may alternatively be vertically stacked. The pixel sensor 102 may, for example, be a four-transistor (4T) CMOS active pixel sensor (APS) or the like, and/or may, for example, also be known as a pixel.

The pixel sensor 102 comprises a pinned photodiode 106 and a pixel circuit 108. In alternative embodiments, the pinned photodiode 106 is some other suitable type of photodetector. The pixel circuit 108 comprises a first transistor 110 at the first IC chip 104a, and further comprises a plurality of second transistors 112 at the second IC chip 104b. Further, the pixel circuit 108 is configured to facilitate readout of the pinned photodiode 106.

A body of the first transistor 110 and an anode of the pinned photodiode 106 are electrically coupled (e.g., shorted) to a first substrate terminal $T_{sub1}$, and individual bodies of the second transistors 112 are electrically coupled (e.g., shorted) to a second substrate terminal $T_{sub2}$. Further, the first substrate terminal $T_{sub1}$ and the second substrate terminal $T_{sub2}$ are electrically isolated from each other. As seen hereafter, the first substrate terminal $T_{sub1}$ may, for example, be defined by or electrically coupled (e.g., shorted) to a bulk of a semiconductor substrate of the first IC chip 104a, whereas the second substrate terminal $T_{sub2}$ may, for example, be defined by or electrically coupled (e.g., shorted) to a bulk of a semiconductor substrate of the second IC chip 104b. Note that a bulk of a semiconductor substrate as used throughout the present disclosure may also be referred to as a body of the semiconductor substrate.

The first transistor 110 is more specifically a transfer transistor 114 gated by a transfer signal TX and is configured to selectively transfer charge that accumulates at the pinned photodiode 106 to a floating diffusion node FD. The second transistors 112 comprise a reset transistor 116, a source-follower transistor 118, and a select transistor 120.

During use of the image sensor, the first substrate terminal $T_{sub1}$ may be biased with a negative voltage $V_{NV}$ and the second substrate terminal $T_{sub2}$ may be biased to ground GND. Note that the negative voltage $V_{NV}$ is negative relative to ground GND and, in some embodiments, is about 0 to –5 volts or some other suitable value. Accordingly, the anode of the pinned photodiode 106 and the body of the transfer transistor 114 may be electrically coupled (e.g., shorted) to the negative voltage $V_{NV}$, whereas the individual bodies of the second transistors 112 may be electrically coupled (e.g., shorted) to ground GND.

Because the anode of the pinned photodiode 106 and the body of the transfer transistor 114 are electrically coupled to the negative voltage $V_{NV}$, the pinning voltage of the pinned photodiode 106 and the turn-on voltage of the transfer transistor 114 are relative to the negative voltage $V_{NV}$ rather than ground GND. This has the effect of increasing these voltages by a magnitude of the negative voltage $V_{NV}$, which increases the FWC of the pinned photodiode 106 and hence enhances performance of the image sensor.

Because voltages of the second transistors 112 are relative to ground GND rather than the negative voltage $V_{NV}$, the second transistors 112 are not subjected to the higher voltages that the pinned photodiode 106 and the transfer transistor 114 are subjected to. As such, endurance and reliability of the second transistors 112 are not impacted by the higher voltages at the pinned photodiode 106 and the transfer transistor 114. Further, power consumption at the second transistors 112 is not impacted (e.g., increased) by the higher voltages.

Because the pixel sensor 102 is spread across the first and second IC chips 104a, 104b, the pixel sensor 102 has fewer transistors at the first IC chip 104a than it would otherwise have. This allows the pixel sensor 102 to be scaled down at the first IC chip 104a without scaling down the pinned photodiode 106. Because the pinned photodiode 106 is relatively large and is at the first IC chip 104a, but not at the second IC chip 104b, the portion of the pixel sensor 102 at the first IC chip 104a may be what limits scaling down of the pixel sensor 102. Hence, the portion of the pixel sensor 102 at the second IC chip 104b may have unused space. This unused space may be used for additional functionality. Additionally, scaling down the pixel sensor 102 at the first IC chip 104a may have the effect of scaling down the entire pixel sensor. Because the pixel sensor 102 may be scaled down without scaling down the pinned photodiode 106, as described above, performance of the pixel sensor 102 may be high even at small sizes.

With continued reference to FIG. 1, the reset transistor 116 is gated by a reset signal RST and is electrically coupled from a reset voltage $V_{RST}$ to the floating diffusion node FD. The reset transistor 116 is configured to selectively electrically couple the floating diffusion node FD to the reset voltage $V_{RST}$ to reset the floating diffusion node FD to the reset voltage $V_{RST}$. Further, through coordination with the transfer transistor 114, the reset transistor 116 is configured to selectively electrically couple the pinned photodiode 106 to the reset voltage $V_{RST}$ to reset the pinned photodiode 106 to a pinning voltage.

The source-follower transistor 118 is gated by charge at the floating diffusion node FD. For example, the gate of the source-follower transistor 118 may be electrically coupled (e.g., shorted) to the floating diffusion node FD and/or a source/drain region of the transfer transistor 114. Further, the select transistor 120 is gated by a select signal SEL. The source-follower transistor 118 and the select transistor 120 are electrically coupled in series from a supply voltage $V_{DD}$ to an output OUT of the pixel sensor 102. The source-follower transistor 118 is configured to buffer and amplify a voltage at the floating diffusion node FD for non-destructively reading the voltage. The select transistor 120 is configured to selectively pass a buffered and amplified voltage from the source-follower transistor 118 to the output OUT.

During operation of the pixel sensor, the pinned photodiode 106 is reset to a pinning voltage by electrically coupling a cathode of the pinned photodiode 106 to the reset voltage $V_{RST}$ with the transfer transistor 114 and the reset transistor 116. Further, the floating diffusion node FD is reset to the reset voltage $V_{RST}$ by electrically coupling the floating diffusion node FD to the reset voltage $V_{RST}$ with the reset transistor 116. Thereafter, incident radiation on the pinned photodiode 106 causes charge to accumulate at the pinned photodiode 106. After charge has accumulated for a suitable amount of time, the charge is transferred to the floating diffusion node FD with the transfer transistor 114. The source-follower transistor 118 buffers and amplifies the voltage at the floating diffusion node FD, and the select transistor 120 passes the buffered and amplified voltage from the source-follower transistor 118 to the output OUT.

In some embodiments, the negative voltage $V_{NV}$ persists at the first substrate terminal $T_{sub1}$ from resetting the pinned photodiode 106 and the floating diffusion node FD to outputting the buffered and amplified voltage at the output OUT. In other embodiments, the first substrate terminal $T_{sub1}$ is biased to ground GND while buffering and amplifying the voltage at the floating diffusion node FD, and while passing the buffered and amplified voltage from the source-follower transistor 118 to the output OUT. In such other embodiments, the negative voltage $V_{NV}$ otherwise persists at the first substrate terminal $T_{sub1}$. For example, the negative voltage $V_{NV}$ may otherwise persist at the first substrate terminal $T_{sub1}$ while resetting and while accumulating charge. Changing the negative voltage $V_{NV}$ to ground GND during readout as above may, for example, increase signal-to-noise ratio (SNR) at the output OUT.

In some embodiments, the first and second transistors 110, 112 are metal-oxide-semiconductor field-effector transistors (MOSFETs), fin field-effect transistors (FinFETs), gate-all-around field-effect transistors (GAA FETs), nanosheet field-effect transistors, the like, or any combination of the foregoing. Note that in at least some embodiments (e.g., where the first and second transistors 110, 112 are MOSFETs or the like), the first and second transistors 110, 112 have individual body diodes, which are not shown.

In some embodiments, the first and second transistors 110, 112 are in ON or conducting states in response to a common turn-on voltage at corresponding gate electrodes. The common turn-on voltage is relative to ground GND at each of the first and second transistors 110, 112 and may, for example, be about 2.8 volts, about 2.5-3.0 volts, or some other suitable voltage. Because the body of the first transistor 110 is electrically coupled (e.g., shorted) to the negative voltage $V_{NV}$, rather than ground GND, the common turn-on voltage is effectively increased by a magnitude of the negative voltage $V_{NV}$ at the first transistor 110 and is hence larger at the first transistor 110 than at the second transistors 112.

In some embodiments, the first and second transistors 110, 112 are in OFF or non-conducting states in response to separate turn-off voltages at corresponding gate electrodes. The first transistor 110 has a first turn-off voltage, and the second transistors 112 have a second turn-off voltage. The first and second turn-off voltages are relative to ground GND. Further, the first turn-off voltage is closer to the negative voltage $V_{NV}$ than the second turn-off voltage, whereas the second turn-off voltage is closer to ground GND than the first turn-off voltage. The first turn-off voltage may, for example, be about equal to the negative voltage $V_{NV}$, about equal to the negative voltage $V_{NV}$ less about 1.2 volts, or some other suitable voltage. The second turn-off voltage may, for example, be about 0 volts or some other suitable voltage.

Figure 2:
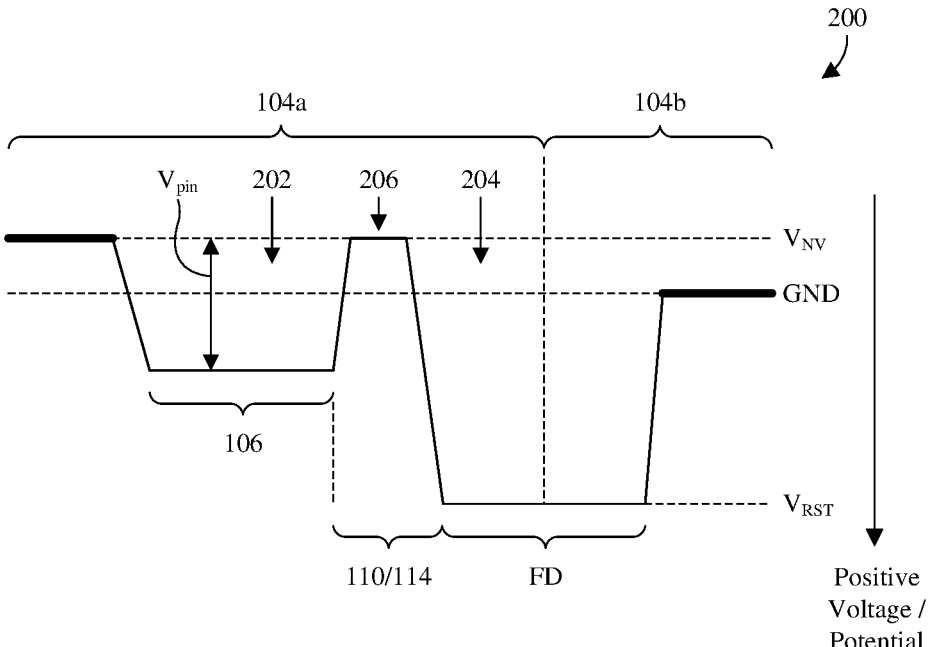
FIG. 2 illustrates a potential diagram for some embodiments of the image sensor of FIG. 1.

With reference to FIG. 2, a potential diagram 200 of some embodiments of the image sensor of FIG. 1 is provided when the pixel sensor 102 is in a reset state. The pinned photodiode 106 has a first potential well 202 at which negative charge may accumulate in response to incident radiation, and the floating diffusion node FD has a second potential well 204 to which negative charge from the first potential well 202 may be transferred.

The first potential well 202 has a depth defined by a pinning voltage $V_{pin}$ of the pinned photodiode 106. The pinning voltage $V_{pin}$ is relative to the negative voltage $V_{NV}$ rather than ground GND, such that the pinning voltage $V_{pin}$ is larger than it would otherwise be and is effectively increased by a magnitude of the negative voltage. Because of the increased pinning voltage $V_{pin}$, the depth of the first potential well 202 is greater than it would otherwise be and the FWC capacity of the pinned photodiode 106 is larger than it would otherwise be.

The second potential well 204 straddles the first and second IC chips 104a, 104b, such that a portion of the second potential well 204 is at the first IC chip 104a and a portion of the second potential well 204 is at the second IC chip 104b. Further, the second potential well 204 has a depth defined by a reset voltage $V_{RST}$. The reset voltage $V_{RST}$ is effectively increased by a magnitude of the negative voltage $V_{NV}$ at the first IC chip 104a, such that the depth is greater at the first IC chip 104a than at the second IC chip 104b. As seen hereafter, this may be because the bulk of the semiconductor substrate of the first IC chip 104a is electrically coupled (e.g., shorted) to the negative voltage $V_{NV}$, whereas the bulk of the semiconductor substrate of the second IC chip 104b is electrically coupled (e.g., shorted) to ground GND.

The transfer transistor 114 forms a barrier 206 separating the first and second potential wells 202, 204 from each other when the transfer transistor 114 is in an OFF or non-conducting state. This, in turn, prevents negative charge that accumulates in the first potential well 202 from migrating from the first potential well 202 to the second potential well 204. Further, when the transfer transistor 114 is in an ON or conducting state, the barrier 206 is removed and the potential at the transfer transistor 114 is between and offset from the potential at the bottom of the first potential well 202 and the potential at the bottom of the second potential well 204. Because negative charge migrates from low potential to high potential, this results in negative charge in the first potential well 202 migrating to the second potential well 204.

Figure 3:
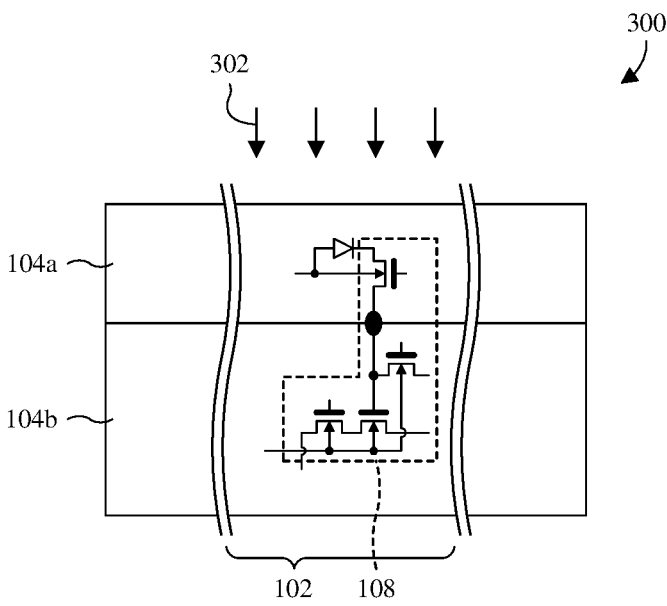
FIG. 3 illustrates a schematic cross-sectional view of some embodiments of the image sensor of FIG. 1.

With reference to FIG. 3, a schematic cross-sectional view 300 of some embodiments of the image sensor of FIG. 1 is provided in which the first and second IC chips 104a, 104b are vertically stacked. The first IC chip 104a overlies the second IC chip 104b, and the image sensor is configured to receive radiation 302 from a top of the image sensor.

Figure 4:
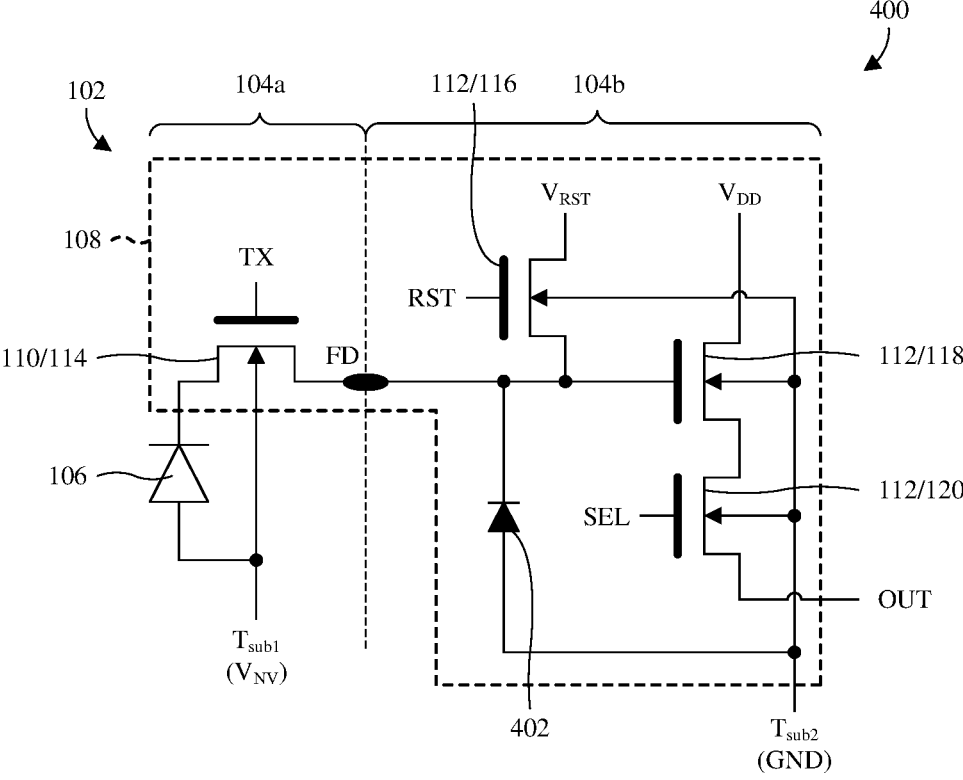
FIG. 4 illustrates a circuit diagram of some embodiments of the image sensor of FIG. 1 in which a body diode of a reset transistor is illustrated.

With reference to FIG. 4, a circuit diagram 400 of some embodiments of the image sensor of FIG. 1 is provided in which a body diode 402 of the reset transistor 116 is illustrated at a source/drain region of the reset transistor 116.

Note that source/drain region(s) may refer to a source or a drain, individually or collectively dependent upon the context. The body diode 402 corresponds to a PN junction defined in part by the source/drain region. Further, the body diode 402 has an anode electrically coupled (e.g., shorted) to the second substrate terminal $T_{sub2}$ and a cathode electrically coupled (e.g., shorted) to the source/drain region.

While not shown, the reset transistor 116 may have an additional body diode at another source/drain region of the reset transistor 116. Further, the first transistor 110 and a remainder of the second transistors 112 may have individual body diodes similar to the body diode 402 of the reset transistor 116. In contrast with the body diode 402 of the reset transistor 116, the body diode of the first transistor 110 may have an anode electrically coupled (e.g., shorted) to the first substrate terminal $T_{sub1}$ instead of the second substrate terminal $T_{sub2}$.

Figure 5A:
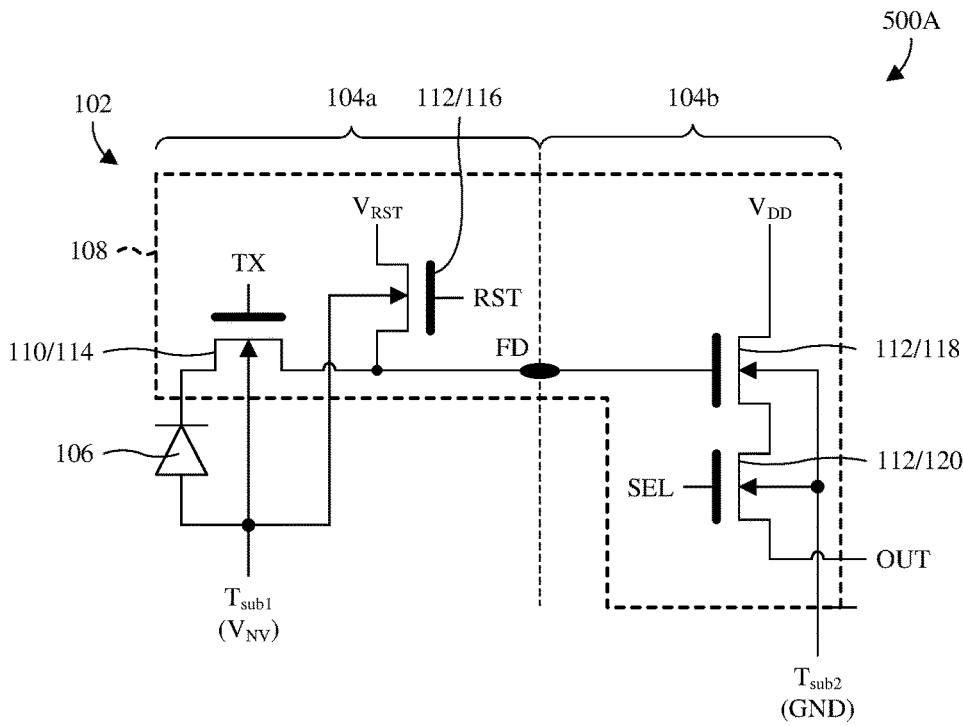
FIGS. 5A and 5B illustrate circuit diagrams of some alternative embodiments of the image sensor of FIG. 1 in which constituents of the image sensor are varied.
Figure 5B:
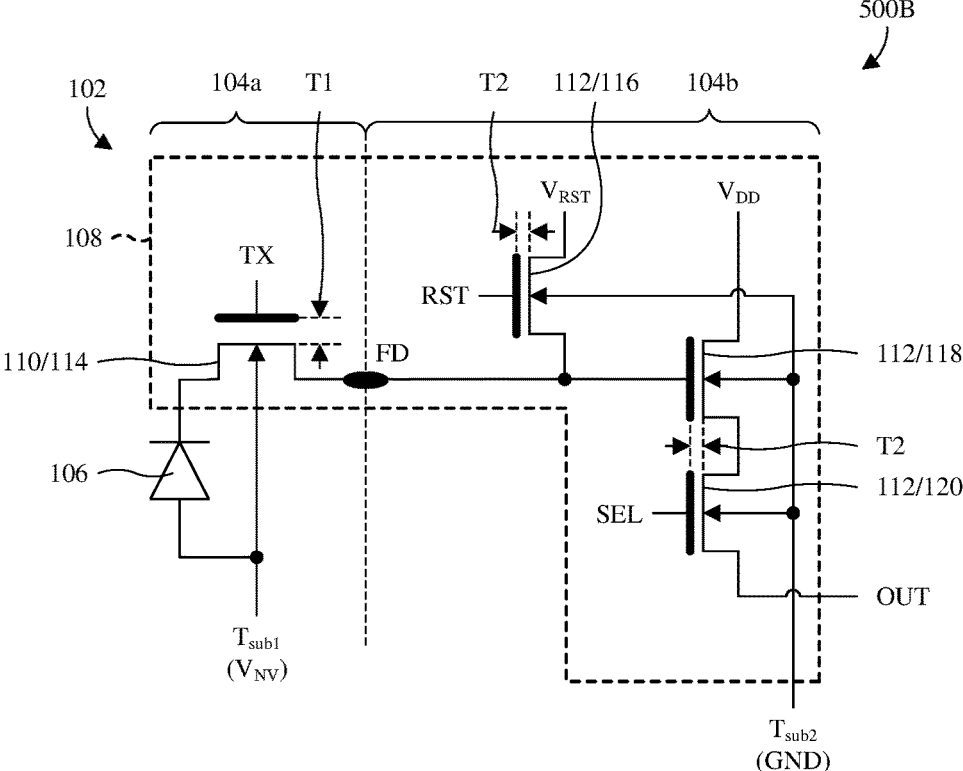

With reference to FIGS. 5A and 5B, circuit diagrams 500A, 500B of some alternative embodiments of the image sensor of FIG. 1 are provided in which constituents of the image sensor are varied.

At FIG. 5A, the reset transistor 116 is at the first IC chip 104a rather than the second IC chip 104b. As such, the pixel sensor 102 comprises a plurality of first transistors 110, including the transfer transistor 114 and the reset transistor 116. Further, individual bodies of the first transistors 110, including a body of the reset transistor 116, are electrically coupled (e.g., shorted) to the first substrate terminal $T_{sub1}$.

At FIG. 5B, the first transistor 110 has a first gate dielectric thickness T1, whereas the second transistors 112 share a second gate dielectric thickness T2 less than the first gate dielectric thickness T1. In alternative embodiments, the second transistors 112 have individual gate dielectric thicknesses that are different and that are each less than the first gate dielectric thickness T1. The first gate dielectric thickness T1 may, for example, be greater than the second gate dielectric thickness T2 so the first transistor 110 can better handle the higher turn-on voltage of the first transistor 110. As noted above, the turn-on voltage of the first transistor 110 is effectively increased by the negative voltage $V_{NV}$ because the body of the first transistor 110 is electrically coupled (e.g., shorted) to the negative voltage $V_{NV}$.

In some embodiments, the first gate dielectric thickness T1 is about 1-1000 angstroms, about 1-500 angstroms, about 500-1000 angstroms, or some other suitable value, and/or the second gate dielectric thickness T2 is about 1-500 angstroms, about 1-250 angstroms, about 250-500 angstroms, or some other suitable value.

Figure 6:
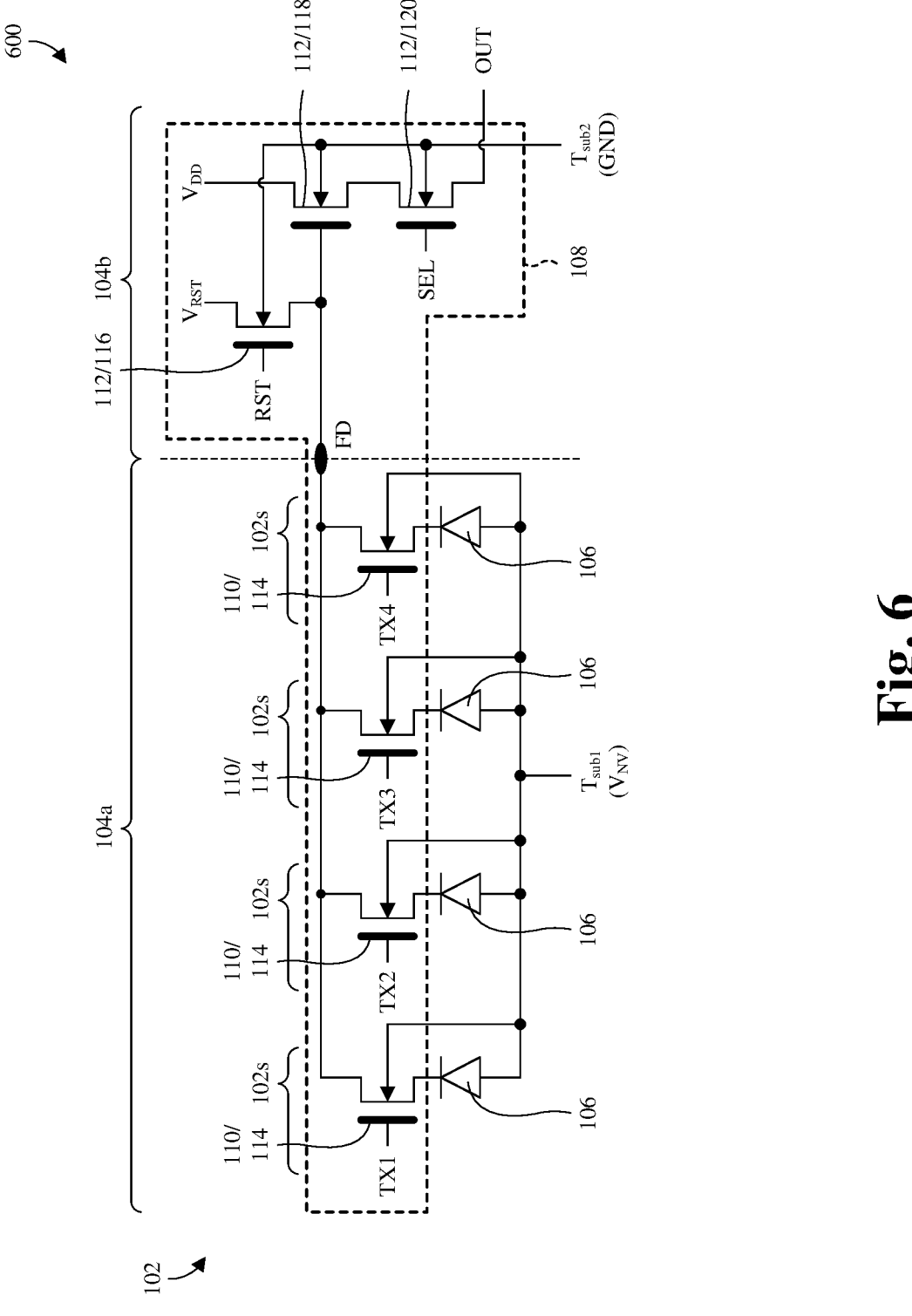
FIG. 6 illustrates a circuit diagram of some alternative embodiments of the image sensor of FIG. 1 in which a pixel sensor comprises a plurality of subpixels.

With reference to FIG. 6, a circuit diagram 600 of some alternative embodiments of the image sensor of FIG. 1 is provided in which the pixel sensor 102 comprises a plurality of subpixels 102s at the first IC chip 104a. More particularly, the pixel sensor 102 comprises a plurality of pinned photodiodes 106 and a plurality of first transistors 110 at the first IC chip 104a. The pinned photodiodes 106 are paired with the first transistors 110 with a one-to-one correspondence, and each photodiode-transistor pair forms a subpixel 102s. In alternative embodiments, the pinned photodiodes 106 are some other suitable type of photodetector.

The pinned photodiodes 106 are electrically coupled (e.g., shorted) from the first substrate terminal $T_{sub1}$ respectively to the first transistors 110. For examples, anodes of the pinned photodiodes 106 are electrically coupled (e.g., shorted) to the first substrate terminal $T_{sub1}$, and cathodes of the pinned photodiodes 106 are electrically coupled respectively to the first transistors 110. The first transistors 110 are transfer transistors 114 gated respectively by individual transfer signals TX1, TX2, TX3, and TX4 and configured to selectively transfer charge that accumulates at the pinned photodiodes 106 to the floating diffusion node FD. The floating diffusion node FD is common to the subpixels 102s. Further, the second transistors 112 are as in FIG. 1 and are shared by the subpixels 102s.

While FIG. 6 illustrates the pixel sensor 102 with a plurality of transfer transistors 114, the pixel sensor 102 may additionally or alternatively have a plurality of reset transistors 116 and/or a plurality of source-follower transistors 118. The plurality of reset transistors 116 may be electrically coupled in parallel. Alternatively, the plurality of reset transistors 116 may be individual to the subpixels 102s. In such alternative embodiments, the pixel sensor 102 may have a plurality of floating diffusion nodes FD individual to the subpixels 102s, and may further have a plurality of source-follower transistors 118 individual to the subpixels 102s.

Figure 7:
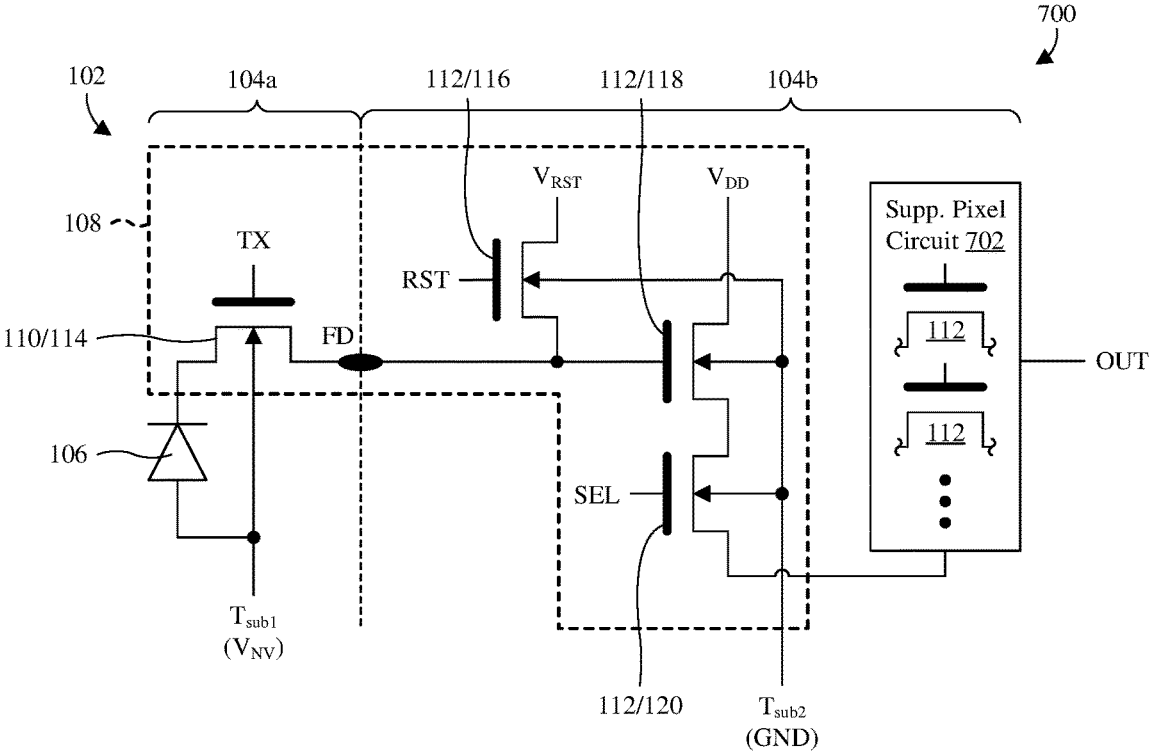
FIG. 7 illustrates a circuit diagram of some alternative embodiments of the image sensor of FIG. 1 in which a pixel sensor comprises a supplemental pixel circuit.

With reference to FIG. 7, a circuit diagram 700 of some alternative embodiments of the image sensor of FIG. 1 is provided in which the pixel sensor 102 has a supplemental pixel circuit 702. The supplemental pixel circuit 702 is electrically coupled between the select transistor 120 and the output OUT of the pixel sensor 102 and is formed by the second transistors 112. Note that the ellipses at the supplemental pixel circuit 702 is used to represent zero or more additional second transistors. Further, the supplemental pixel circuit 702 is configured to perform additional processing on a signal from the select transistor 120 before passing it to the output OUT. For example, noise filtering or the like may be performed.

Because the pinned photodiode 106 is relatively large and is at the first IC chip 104a, but not at the second IC chip 104b, the portion of the pixel sensor 102 at the first IC chip 104a may be what limits scaling down of the pixel sensor 102. Therefore, the portion of the pixel sensor 102 at the second IC chip 104b may have free space that enables integration of the supplemental pixel circuit 702 into the pixel sensor 102 without enlarging the pixel sensor 102.

Figure 8:
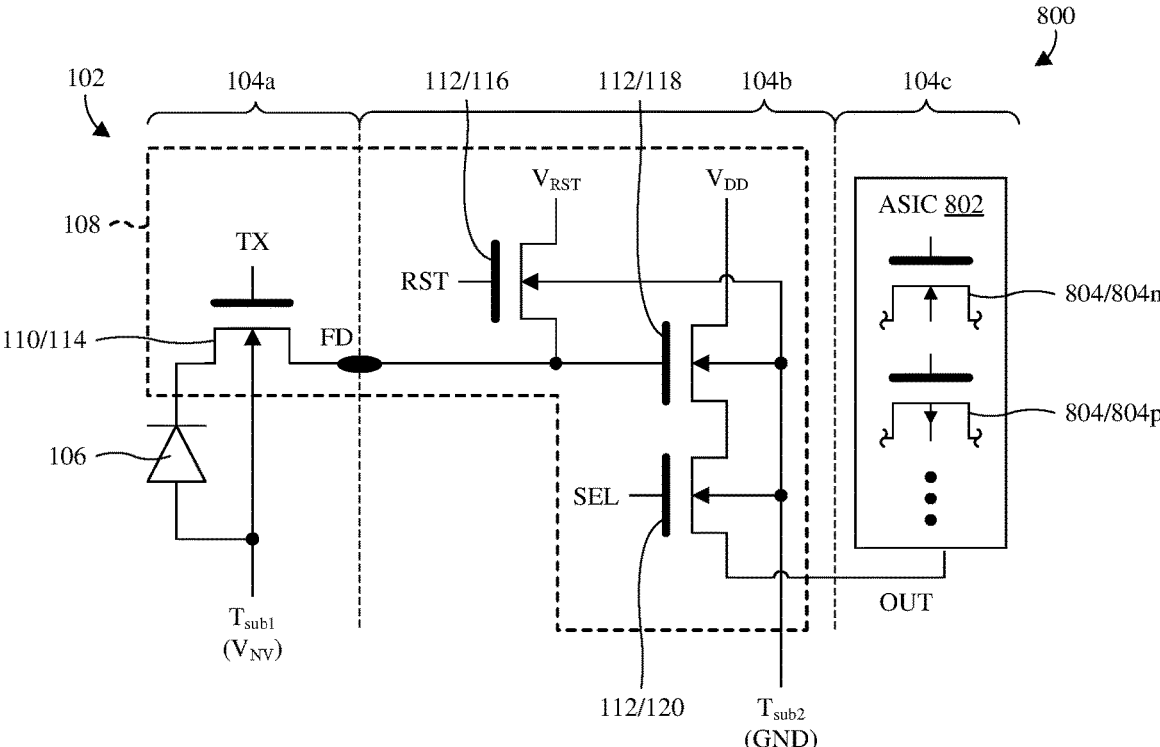
FIG. 8 illustrates a circuit diagram of some alternative embodiments of the image sensor of FIG. 1 in which the image sensor further includes a third IC chip.

With reference to FIG. 8, a circuit diagram 800 of some alternative embodiments of the image sensor of FIG. 1 is provided in which the image sensor further includes a third IC chip 104c. The third IC chip 104c accommodates an ASIC 802 that is electrically coupled to the pixel sensor 102 and any other pixel sensors (not shown) of the image sensor. The ASIC 802 may, for example, be configured to perform analog-to-digital conversion (ADC), buffering, image processing, the like, or any combination of the foregoing. In some embodiments, the ASIC 802 buffers and performs ADC on the output OUT of the pixel sensor 102 and outputs of any other pixel sensors of the image sensor to generate digital data representing an image, and then performs imaging processing on the image formed by the digital data.

The third IC chip 104c comprises a plurality of third transistors 804 electrically interconnected to form the ASIC 802, and the plurality of third transistors 804 comprises at least one n-type transistor 804n and at least one p-type transistor 804p. Note that the ellipses at the ASIC 802 is used to represent zero or more additional third transistors. The plurality of third transistors 804 may, for example, be MOSFETs, FinFETs, GAA FETs, nanosheet field-effect transistors, some other suitable type of transistors, or any combination of the foregoing.

Figure 9:
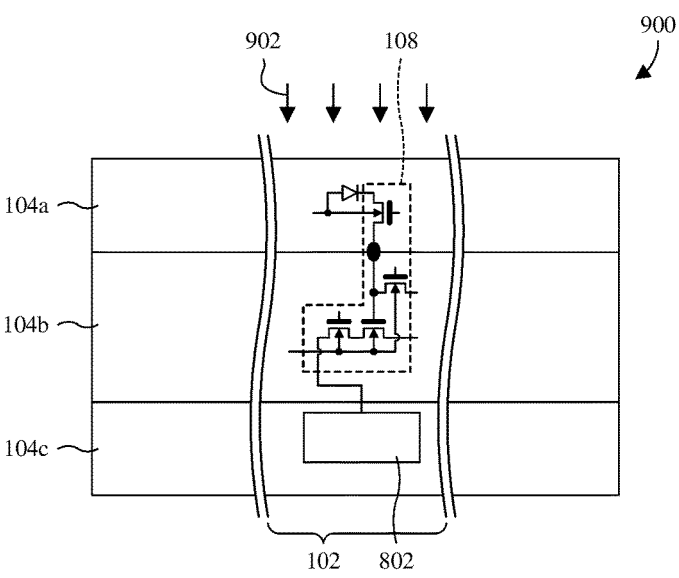
FIG. 9 illustrates a schematic cross-sectional view of some embodiments of the image sensor of FIG. 8.

With reference to FIG. 9, a schematic cross-sectional view 900 of some embodiments of the image sensor of FIG. 8 is provided in which the first, second, and third IC chips 104a-104c are vertically stacked. The first IC chip 104a is at a top of the image sensor, and the second IC chip 104b is between the first and third IC chips 104a, 104c. Further, the image sensor is configured to receive radiation 902 from the top of the image sensor.

Figure 10:
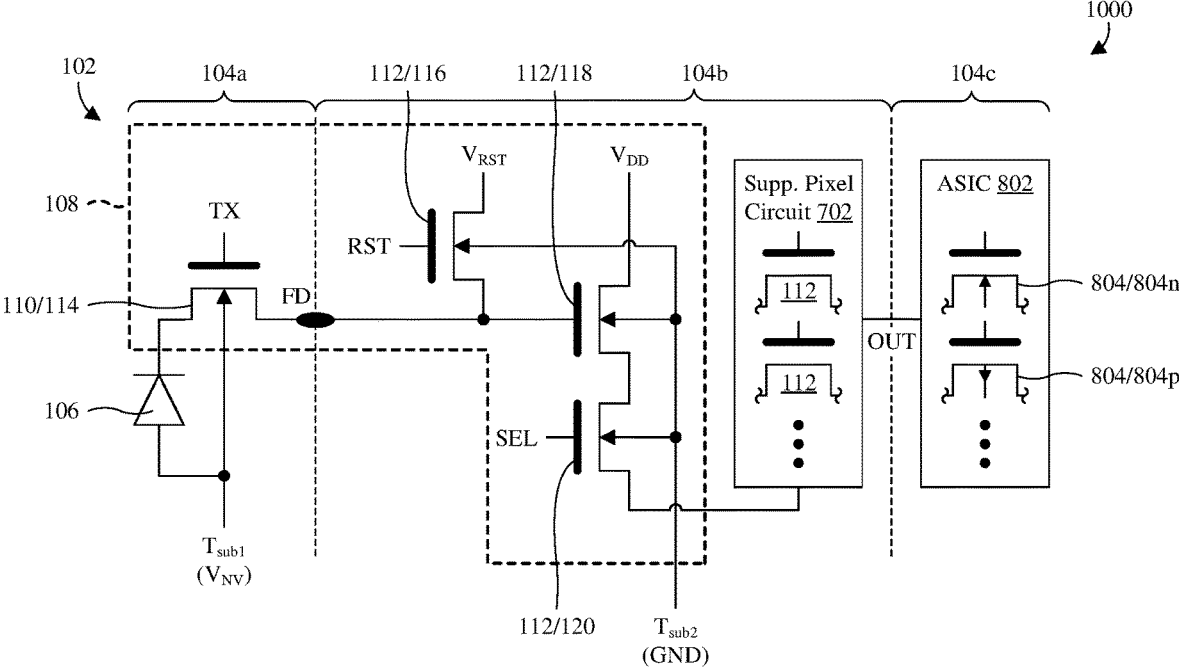
FIG. 10 illustrates a circuit diagram of some alternative embodiments of the image sensor of FIG. 8.

With reference to FIG. 10, a circuit diagram 1000 of some alternative embodiments of the image sensor of FIG. 8 is provided in which the pixel sensor 102 includes the supplemental pixel circuit 702 described with regard to FIG. 7. The supplemental pixel circuit 702 is electrically coupled between the select transistor 120 and the output OUT of the pixel sensor 102 and is formed by the second transistors 112. Note that the ellipses at the supplemental pixel circuit 702 is used to represent zero or more additional second transistors.

Figure 11:
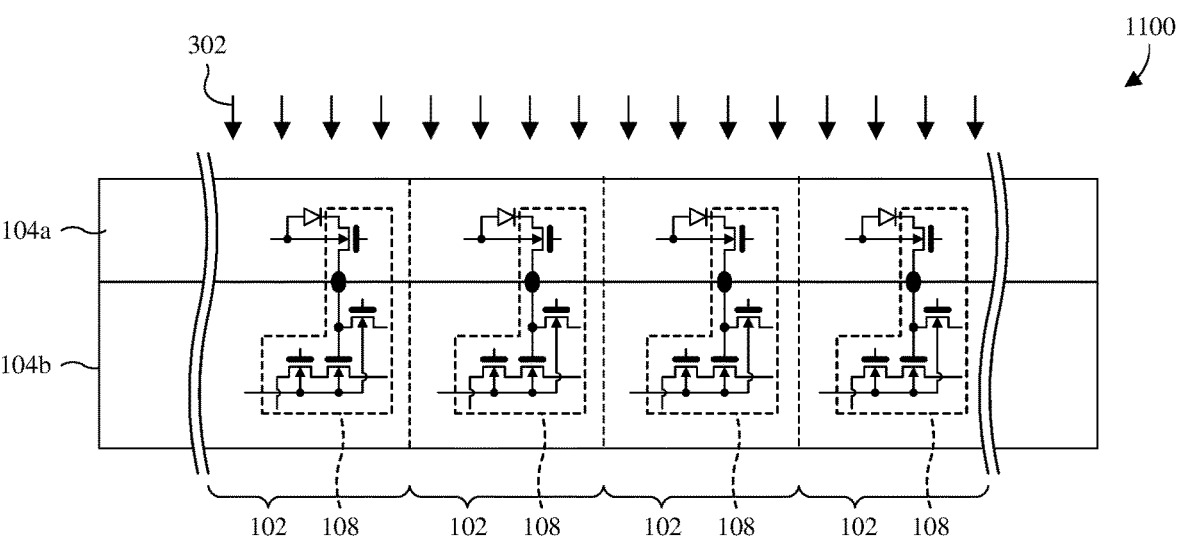
FIG. 11 illustrates a schematic cross-sectional view of some embodiments of an image sensor comprising a plurality of pixel sensors each as in FIG. 1.

With reference to FIG. 11, a schematic cross-sectional view 1100 of some embodiments of an image sensor comprising a plurality of pixel sensors 102 each as in FIG. 1 is provided. Put another way, the pixel sensor 102 of FIG. 1 repeats, such that there are multiple instances or repetitions of the pixel sensor of FIG. 1. In alternative embodiments, the pixel sensors 102 are each as in any of FIGS. 4, 5A, 5B, 6, and 7. Further, the first and second IC chips 104a, 104b are vertically stacked. The first IC chip 104a overlies the second IC chip 104b, and the image sensor is configured to receive radiation 302 from a top of the image sensor.

Figure 12:
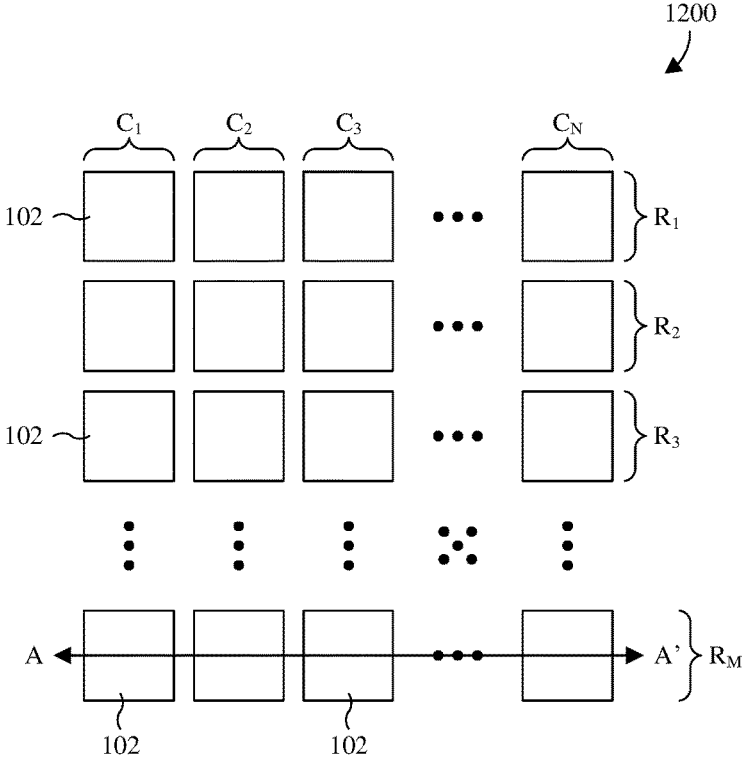
FIG. 12 illustrates a top layout view of some embodiments of the image sensor of FIG. 11.

With reference to FIG. 12, a top layout view 1200 of some embodiments of the image sensor of FIG. 11 is provided in which the plurality of pixel sensors 102 is in a plurality of rows and a plurality of columns. The schematic cross-sectional view 1100 of FIG. 11 may, for example, be taken along line A-A' in FIG. 12.

The plurality of rows includes rows $R_1$, $R_2$, $R_3$, and $R_M$, and the plurality of columns includes columns $C_1$, $C_2$, $C_3$, and $C_N$. Subscripts of the row labels correspond to row numbers, where M is an integer greater than three. Similarly, subscripts of the column labels correspond to column numbers, where N is an integer greater than three. Further, the plurality of rows and columns form a two-dimensional array in which the pixel sensors 102 are in a periodic, grid pattern. Other suitable patterns are amenable in alternative embodiments.

Figure 13:
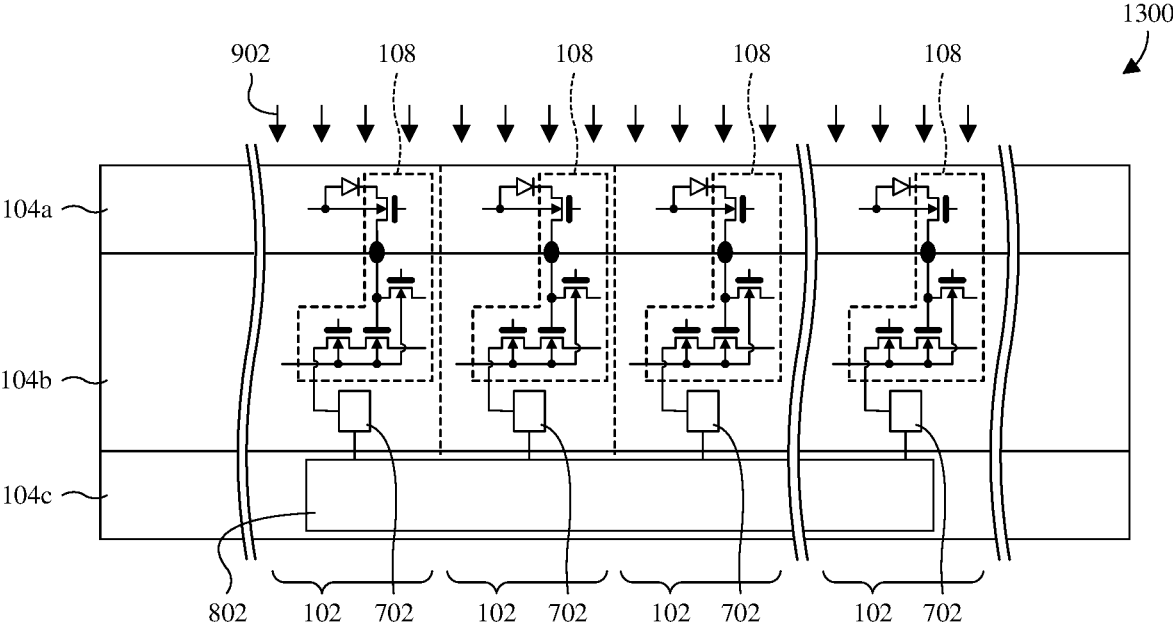
FIG. 13 illustrates a schematic cross-sectional view of some embodiments of an image sensor comprising a plurality of pixel sensors each as in FIG. 10.

With reference to FIG. 13, a schematic cross-sectional view 1300 of some embodiments of an image sensor comprising a plurality of pixel sensors 102 each as in FIG. 10 is provided. Put another way, the pixel sensor 102 of FIG. 10 repeats, such that there are multiple instances or repetitions of the pixel sensor of FIG. 10. In alternative embodiments, the pixel sensors 102 are each as in FIG. 8. Further, the ASIC 802 is shared by the pixel sensors 102. For example, there may be a many-to-one correspondence between the pixel sensors 102 and the ASIC 802. Further yet, the first, second, third IC chips 104a-104c are vertically stacked. The second IC chip 104b is between the first and third IC chips 104a, 104c, and the image sensor is configured to receive radiation 902 from a top of the image sensor.

While FIG. 12 is described with regard to the image sensor of FIG. 11, it is to be appreciated that FIG. 12 is also applicable to the image sensor of FIG. 13. For example, the schematic cross-sectional view 1300 of FIG. 13 may be taken along line A-A' in FIG. 12.

Figure 14:
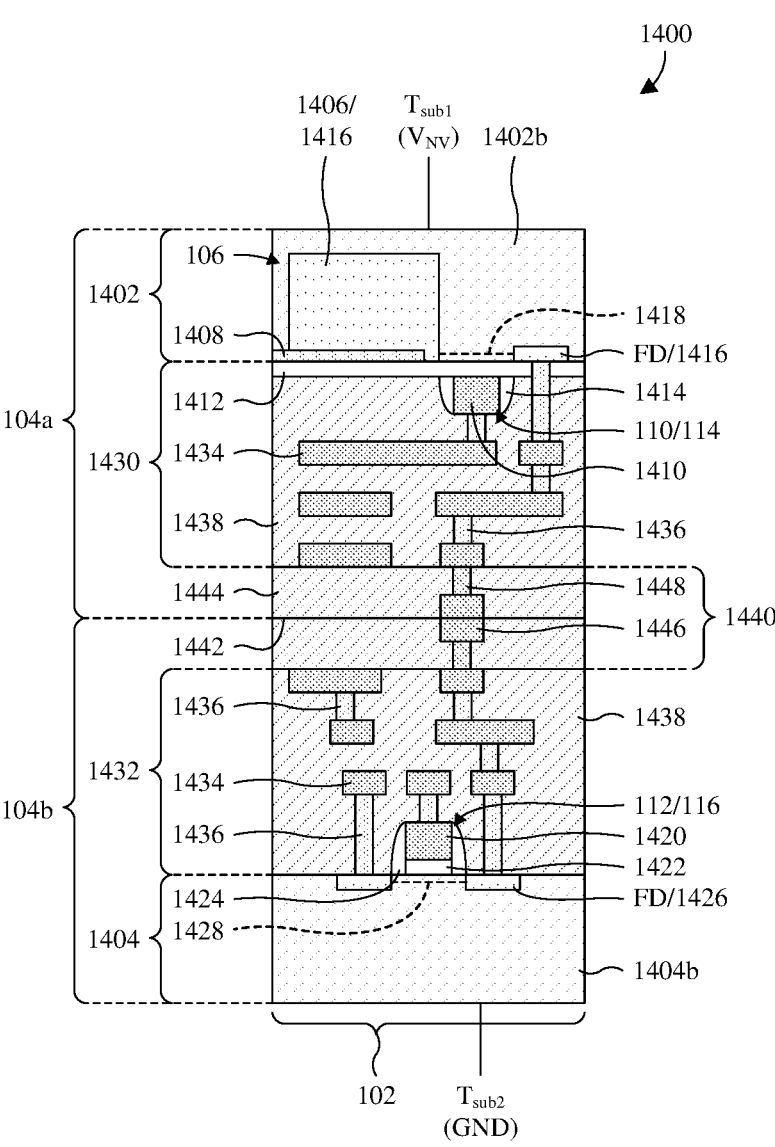
FIG. 14 illustrates a cross-sectional view of some embodiments of the image sensor of FIG. 1.

With reference to FIG. 14, a cross-sectional view 1400 of some embodiments of the image sensor of FIG. 1 is provided. The first and second IC chips 104a, 104b are vertically stacked with the first IC chip 104a overlying the second IC chip 104b. The pinned photodiode 106 and the first transistor 110 are at and at least partially defined by a first semiconductor substrate 1402 of the first IC chip 104a, and the second transistors 112 (only one of which is illustrated) are at and partially defined by a second semiconductor substrate 1404 of the second IC chip 104*b*. The first and second semiconductor substrates 1402, 1404 may, for example, be a bulk substrate of monocrystalline silicon, silicon germanium, the like, or any combination of the foregoing, or may, for example, be some other suitable type of semiconductor substrate.

A bulk 1402*b* of the first semiconductor substrate 1402 and a bulk 1404*b* of the second semiconductor substrate 1404 are electrically isolated from each other and are configured to be biased respectively with the negative voltage $V_{NV}$ and ground GND. The bulk 1402*b* of the first semiconductor substrate 1402 defines or is electrically coupled (e.g., shorted) to a body of the first transistor 110 and an anode of the pinned photodiode 106. The bulk 1404*b* of the second semiconductor substrate 1404 defines or is electrically coupled (e.g., shorted) to individual bodies of the second transistors 112 (only one of which is illustrated).

In at least some embodiments, the bulk 1402*b* of the first semiconductor substrate 1402 has a single doping type, and/or the bulk 1404*b* of the second semiconductor substrate 1404 has a single doping type. For example, the bulks 1402*b*, 1404*b* may be p type. Further, in at least some embodiments, the bulk 1402*b* of the first semiconductor substrate 1402 has one or multiple doping concentrations, and/or the bulk 1404*b* of the second semiconductor substrate 1404 has one or multiple doping concentrations.

Because the bulk 1402*b* of the first semiconductor substrate 1402 may be biased with the negative voltage $V_{NV}$, voltages of the pinned photodiode 106 and the first transistor 110, including the pinning voltage of the pinned photodiode 106 and the turn-on voltage of the first transistor 110, may be relative to the negative voltage $V_{NV}$ rather than ground GND. This has the effect of increasing these voltages by a magnitude of the negative voltage $V_{NV}$, which increases the FWC of the pinned photodiode 106 as explained with regard to FIGS. 1 and 2.

Because the bulk 1404*b* of the second semiconductor substrate 1404 may be biased with ground GND rather than the negative voltage $V_{NV}$, voltages of the second transistors 112, including the turn-on voltages of the second transistors 112, are relative to ground GND rather than the negative voltage $V_{NV}$. As such, the second transistors 112 are not subjected to the higher voltages that the pinned photodiode 106 and the first transistor 110 are subjected to. Because the second transistors 112 are not subjected to the higher voltages, endurance and reliability of the second transistors 112 is not impacted by the higher voltages. Further, power consumption at the second transistors 112 is not impacted (e.g., increased) by the higher voltages.

With continued reference to the image sensor of FIG. 14, the pinned photodiode 106 comprises a collector region 1406 and a pinning region 1408 covering the collector region 1406 on a frontside of the first semiconductor substrate 1402. Further, the pinned photodiode 106 comprises a portion of the bulk 1402*b* of the first semiconductor substrate 1402 that adjoins and surrounds the pinning region 1408 and the collector region 1406. During operation, the pinned photodiode 106 receives radiation from over the first semiconductor substrate 1402, which results in the accumulation of charge in the collector region 1406.

The bulk 1402*b* of the first semiconductor substrate 1402 and the pinning region 1408 correspond to doped regions of the first semiconductor substrate 1402 and share a first doping type. Further, the pinning region 1408 has a higher doping concentration than the bulk 1402*b* of the first semiconductor substrate 1402. The collector region 1406 corresponds to a doped region of the first semiconductor substrate 1402 and has a second doping type opposite to the first doping type. For example, the first doping type may be p type, whereas the second doping type may be n type. Further, the collector region 1406 adjoins the pinning region 1408 and the bulk 1402*b* of the first semiconductor substrate 1402 to form a PN junction.

The first transistor 110 borders the pinned photodiode 106 on the frontside of the first semiconductor substrate 1402. Further, the first transistor 110 comprises a first gate electrode 1410, a first gate dielectric layer 1412, a first sidewall spacer 1414, and a pair of first source/drain regions 1416. During operation of the image sensor, the first gate electrode 1410 may be biased with a turn-on voltage so a first channel region 1418 of the first transistor 110 conducts. This leads to a transfer of accumulated charge at the collector region 1406 of the pinned photodiode 106 to the floating diffusion node FD. Hence, the first transistor 110 is more specifically a transfer transistor 114 in the present embodiments.

The first gate electrode 1410 and the first gate dielectric layer 1412 are stacked on the first semiconductor substrate 1402 with the first gate dielectric layer 1412 separating the first gate electrode 1410 from the first semiconductor substrate 1402. Further, the first gate dielectric layer 1412 covers the pinned photodiode 106 on the frontside of the first semiconductor substrate 1402. In alternative embodiments, the first gate dielectric layer 1412 is localized between the first gate electrode 1410 and the first semiconductor substrate 1402.

The first sidewall spacer 1414 is on sidewalls of the first gate electrode 1410 and the first gate dielectric layer 1412. Further, the first sidewall spacer 1414 has a pair of segments between which the first gate electrode 1410 and the first gate dielectric layer 1412 are sandwiched. The first sidewall spacer 1414 is dielectric and may, for example, be or comprise silicon nitride, the like, or any combination of the foregoing.

The first source/drain regions 1416 are in the first semiconductor substrate 1402 and are separated from each other by the first channel region 1418 in the first semiconductor substrate 1402. Further, the first source/drain regions 1416 correspond to doped regions of the first semiconductor substrate 1402 sharing a common doping type, which is opposite to that of the bulk 1402*b* of the first semiconductor substrate 1402. For example, the first source/drain regions 1416 may be n type, and the bulk 1402*b* of the first semiconductor substrate 1402 may be p type. One of the first source/drain regions 1416 is formed by the collector region 1406, and the other one of the first source/drain regions 1416 partially forms the floating diffusion node FD.

The second transistors 112 (only one of which is shown) are on a frontside of the second semiconductor substrate 1404. Further, the second transistors 112 comprise individual second gate electrodes 1420, individual second gate dielectric layers 1422, individual second sidewall spacers 1424, and individual pairs of second source/drain regions 1426. During operation of the image sensor, the reset transistor 116 of the second transistors 112 facilitates resetting of the pinned photodiode 106 to a pinning voltage and further facilitates resetting the floating diffusion node FD to a reset voltage. Further, the source-follower transistor (not shown) of the second transistors 112 and the select transistor (not shown) of the second transistors facilitate non-destructive readout of charge at the floating diffusion node FD.

The second gate electrodes 1420 are stacked respectively with the second gate dielectric layers 1422, which separate the second gate electrodes 1420 from the second semiconductor substrate 1404. The second sidewall spacers 1424 are respectively on sidewalls of the second gate electrodes 1420 and sidewalls of the second gate dielectric layers 1422. As such, each second gate electrode 1420 is sandwiched between segments of a respective second sidewall spacer and each second gate dielectric layer 1422 is sandwiched between segments of a respective second sidewall spacer. The second sidewall spacers 1424 are dielectric and may, for example, be or comprise silicon nitride, the like, or any combination of the foregoing.

The pairs of second source/drain regions 1426 are in the second semiconductor substrate 1404, and a source/drain region of the reset transistor 116 partially forms the floating diffusion node FD. The source/drain regions of each pair of second source/drain regions 1426 correspond to doped regions of the second semiconductor substrate 1404 sharing a common doping type, which is opposite to that of the bulk 1404b of the second semiconductor substrate 1404. For example, the pairs of second source/drain regions 1426 may be n type, whereas the bulk 1404b of the second semiconductor substrate 1404 may be p type. Further, the source/drain regions of each pair of second source/drain regions 1426 are separated from each other by a corresponding second channel region 1428 in the second semiconductor substrate 1404.

The first and second IC chips 104a, 104b respectively comprise a first interconnect structure 1430 and a second interconnect structure 1432. The first and second interconnect structures 1430, 1432 are between the first and second semiconductor substrates 1402, 1404. Further, first and second interconnect structures 1430, 1432 comprise a plurality of conductive wires 1434 and a plurality of conductive vias 1436 stacked in corresponding interconnect dielectric layers 1438. The conductive wires 1434 and the conductive vias 1436 are grouped respectively into a plurality of wire levels and a plurality of via levels that are alternatingly stacked to define conductive paths. Via layers and wire layers at the first interconnect structure 1430 are alternatingly stacked to define conductive paths leading from the first transistor 110. Similarly, via layers and wire layers at the second interconnect structure 1432 are alternatingly stacked to define conductive paths leading from the second transistors 112.

A bond structure 1440 is between the first and second IC chips 104a, 104b and facilitates bonding of the first and second IC chips 104a, 104b together at a bond interface 1442. Such bonding may, for example, include a combination of metal-to-metal bonding and dielectric-to-dielectric bonding at the bond interface 1442.

The bond structure 1440 comprise bond dielectric layers 1444 individual to the first and second IC chips 104a, 104b and directly contacting and bonded together at the bond interface 1442. Further, the bond structure 1440 comprise bond pads 1446 individual to the first and second IC chips 104a, 104b and directly contacting and bonded together at the bond interface 1442. The bond pads 1446 are inset respectively into the bond dielectric layers 1444 and are electrically coupled respectively to the first and second interconnect structures 1430, 1432 by bond vias 1448 respectively in the bond dielectric layers 1444.

Figure 15A:
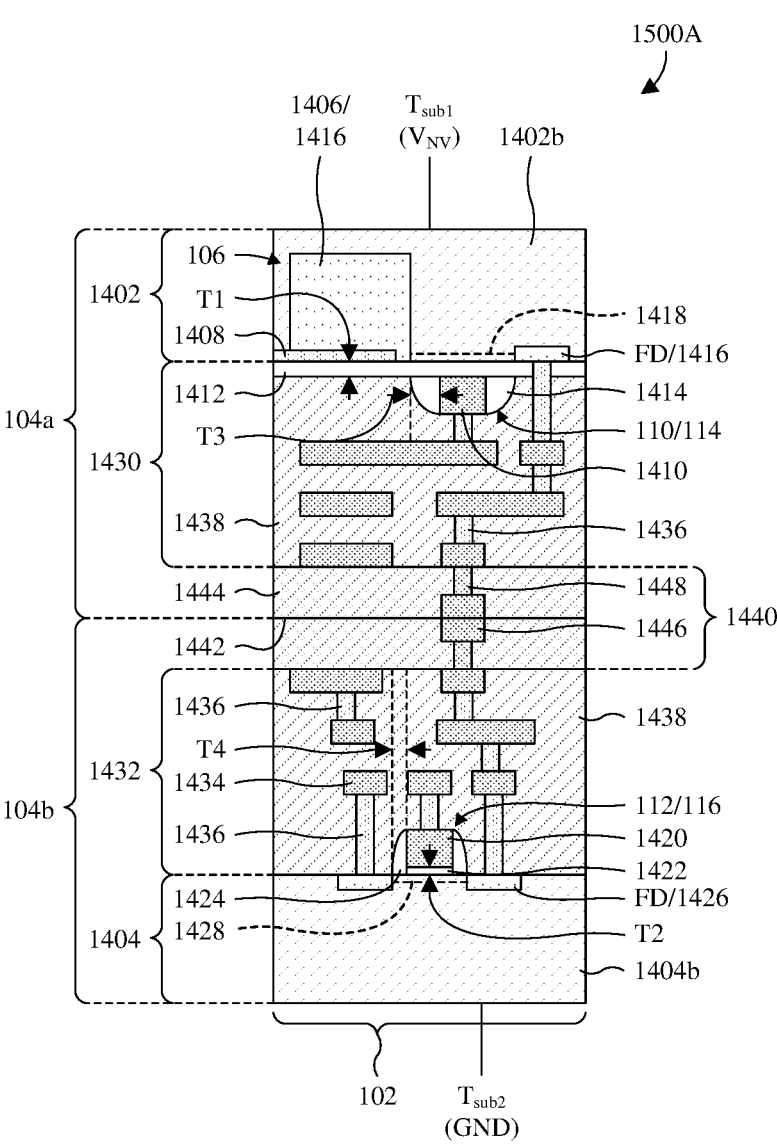
FIGS. 15A and 15B illustrate cross-sectional views of some alternative embodiments of the image sensor of FIG. 14 in which constituents of the image sensor are varied.
Figure 15B:
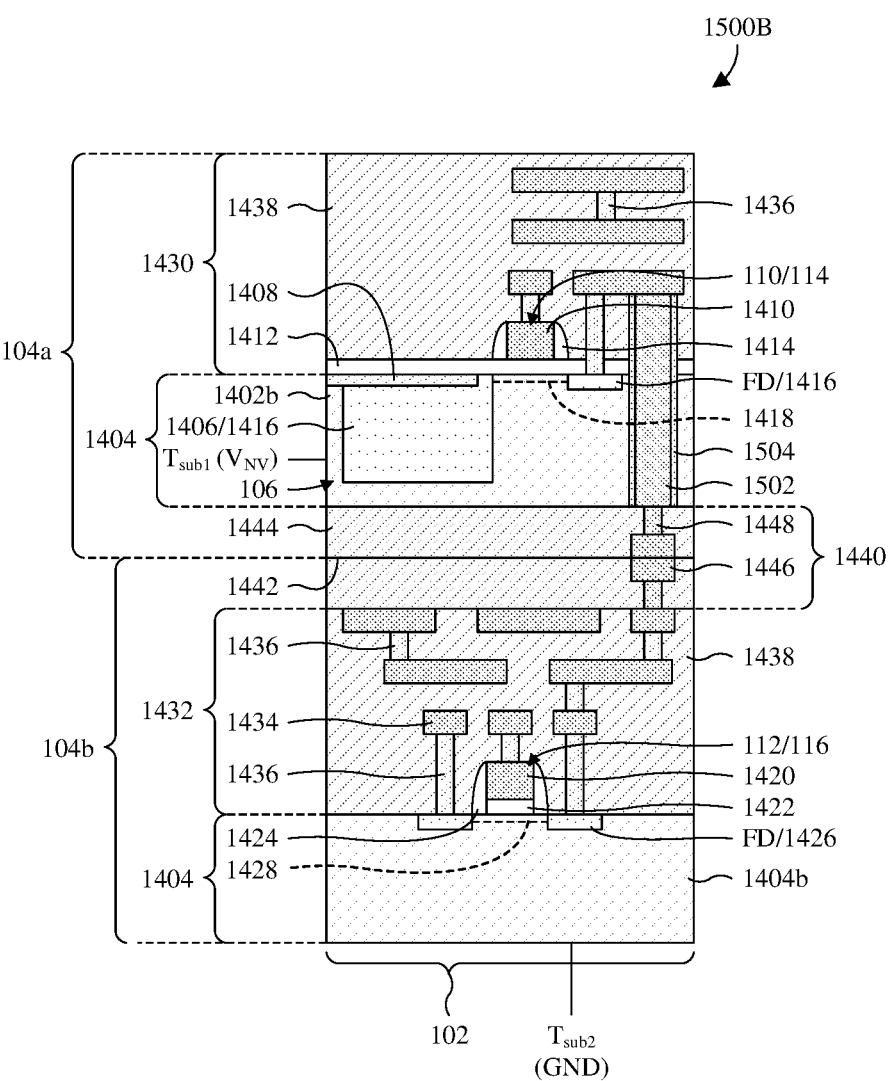

With reference to FIGS. 15A and 15B, cross-sectional views 1500A, 1500B of some alternative embodiments of the image sensor of FIG. 14 are provided in which constituents of the image sensor are varied.

At FIG. 15A, the first gate dielectric layer 1412 has a thickness T1 greater than individual thicknesses T2 of the second gate dielectric layers 1422. Further, the first sidewall spacer 1414 has a thickness T3 greater than individual thicknesses T4 of the second sidewall spacers 1424. As noted above, the turn-on voltage of the first transistor 110 is effectively increased by the negative voltage $V_{NV}$ because the body of the first transistor 110 is electrically coupled (e.g., shorted) to the negative voltage $V_{NV}$. In contrast, the second transistors 112 have individual bodies electrically coupled (e.g., shorted) to ground GND and are hence not subjected higher turn-on voltages. The greater thicknesses of the first gate dielectric layer 1412 and the first sidewall spacer 1414 may, for example, enable the first transistor 110 to better handle the higher turn-on voltages, such that reliability of the first transistor 110 is enhanced. Additionally, the greater thicknesses may reduce gate-induced drain leakage.

At FIG. 15B, the image sensor is frontside illuminated instead of backside illuminated, such that the image sensor is configured to receive incident radiation from a frontside of the first semiconductor substrate 1402. This is to be contrasted with the image sensor of FIG. 14, which is backside illustrated and hence is configured to receive incident radiation from a backside of the first semiconductor substrate 1402. The frontside of the first semiconductor substrate 1402 corresponds to a side of the first semiconductor substrate 1402 at which the first interconnect structure 1430 is arranged, and the backside of the first semiconductor substrate 1402 corresponds to an opposite side of the first semiconductor substrate 1402.

Compared to FIG. 14, the first semiconductor substrate 1402 and the first interconnect structure 1430 are vertically flipped so the first interconnect structure 1430 is over the first semiconductor substrate 1402. Further, a through substrate via (TSV) 1502 extends through the first semiconductor substrate 1402. The TSV 1502 extends from the first interconnect structure 1430 to the bond structure 1440 to provide electrical coupling between the first interconnect structure 1430 and the bond structure 1440. Further, the TSV 1502 is separated from the first semiconductor substrate 1402 by a TSV dielectric layer 1504.

Figure 16:
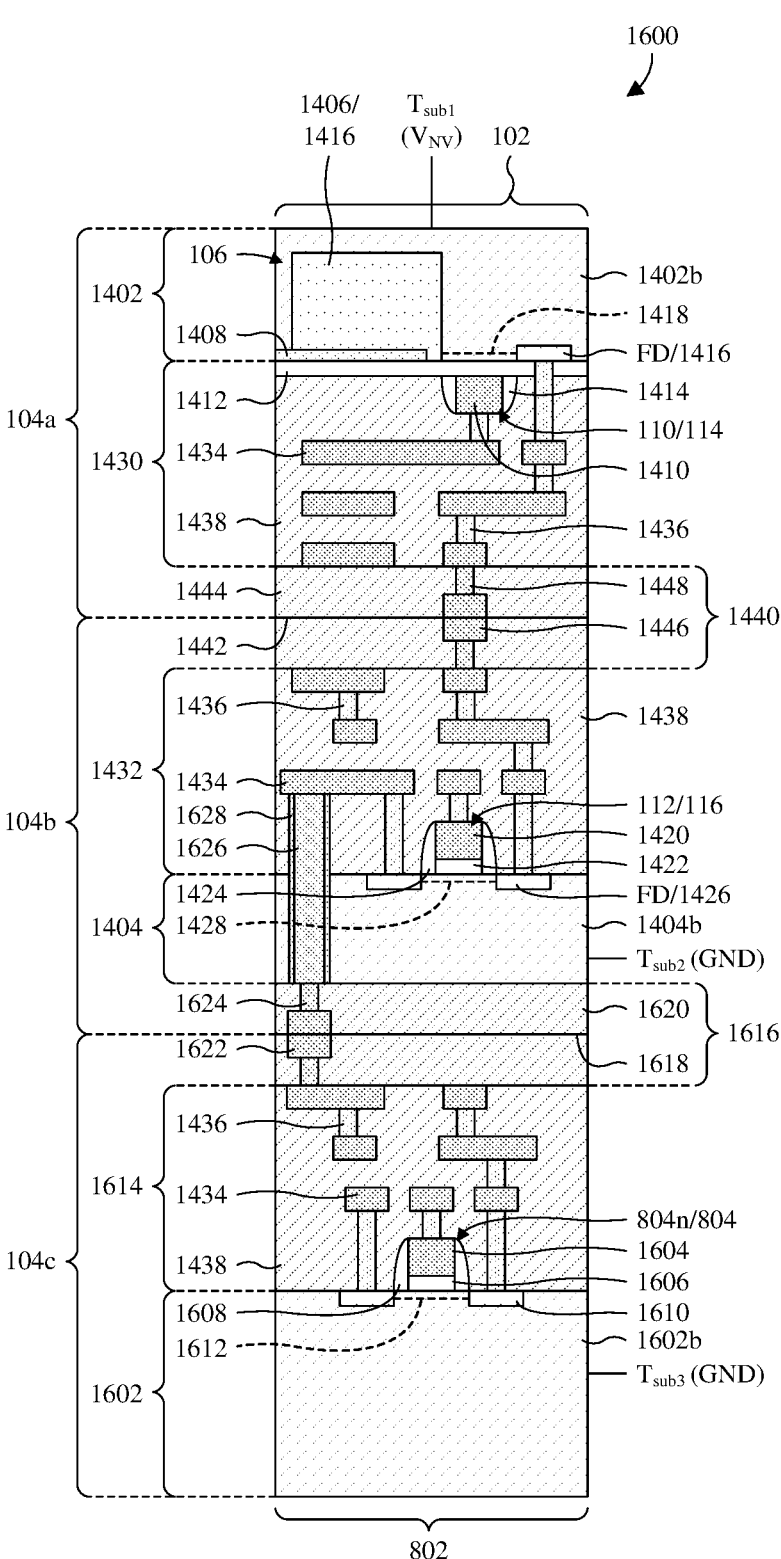
FIG. 16 illustrates a cross-sectional view of some alternative embodiments of the image sensor of FIG. 14 in which the image sensor further includes a third IC chip.

With reference to FIG. 16, a cross-sectional view 1600 of some alternative embodiments of the image sensor of FIG. 14 is provided in which the image sensor further includes the third IC chip 104c. Further, in some embodiments, the image sensor corresponds to the circuit diagram 800 of FIG. 8 or the circuit diagram 1000 of FIG. 10.

The third IC chip 104c is vertically stacked with the first and second IC chips 104a, 104b and underlies the second IC chip 104b. The third transistors 804 are at and at least partially defined by a third semiconductor substrate 1602 of the third IC chip 104c. The third semiconductor substrate 1602 may, for example, be a bulk substrate of monocrystalline silicon, silicon germanium, the like, or any combination of the foregoing, or may, for example, be some other suitable type of semiconductor substrate.

Individual bodies of at least some of the third transistors 804 are electrically coupled (e.g., shorted) to or defined by a bulk 1602b of the third semiconductor substrate 1602. Further, the bulk 1602b of third semiconductor substrate 1602 is electrically coupled (e.g., shorted) to or defines a third substrate terminal $T_{sub3}$. The third substrate terminal $T_{sub3}$ is electrically isolated from the first substrate terminal $T_{sub1}$ and, in some embodiments, the second substrate terminal $T_{sub2}$. As such, the bulk 1602b of the third semiconductor substrate 1602 is electrically isolated from the bulk 1402b of the first semiconductor substrate 1402 and, in some embodiments, the bulk 1404b of the second semiconductor substrate 1404.

During use of the image sensor, the first substrate terminal $T_{sub1}$ may be biased with a negative voltage $V_{NV}$, whereas the second and third substrate terminals $T_{sub2}$, $T_{sub3}$ may be biased to ground GND. As described above, biasing the first substrate terminal $T_{sub1}$ with the negative voltage $V_{NV}$ may enhance the FWC of the pixel sensor 102.

The third transistors 804 (only one of which is shown) are on a frontside of the third semiconductor substrate 1602. Further, the third transistors 804 comprise individual third gate electrodes 1604, individual third gate dielectric layers 1606, individual third sidewall spacers 1608, and individual pairs of third source/drain regions 1610.

The third gate electrodes 1604 are stacked respectively with the third gate dielectric layers 1606, which separate the third gate electrodes 1604 from the third semiconductor substrate 1602. The third sidewall spacers 1608 are respectively on sidewalls of the third gate electrodes 1604 and sidewalls of the third gate dielectric layers 1606. As such, each third gate electrode 1604 is sandwiched between segments of a respective third sidewall spacer and each third gate dielectric layer 1606 is sandwiched between segments of a respective third sidewall spacer. The third sidewall spacers 1608 are dielectric and may, for example, be or comprise silicon nitride, the like, or any combination of the foregoing.

The pairs of third source/drain regions 1610 are in the third semiconductor substrate 1602. The source/drain regions of each pair of third source/drain regions 1610 correspond to doped regions of the third semiconductor substrate 1602 sharing a common doping type, which has an opposite type as the bulk 1602b of the third semiconductor substrate 1602. For example, the pairs of third source/drain regions 1610 may be n type, whereas the bulk 1602b of the third semiconductor substrate 1602 may be p type. Further, the source/drain regions of each pair of third source/drain regions 1610 are separated from each other by a corresponding third channel region 1612 in the third semiconductor substrate 1602.

The third IC chip 104c further comprise a third interconnect structure 1614 between the second and third semiconductor substrates 1404, 1602. The third interconnect structure 1614 covers the third transistors 804 on a frontside of the third interconnect structure 1614. Further, the third interconnect structure 1614 is as the first and second interconnect structures 1430, 1432 are described. Hence, the third interconnect structure 1614 comprises a plurality of additional conductive wires 1434 and a plurality of additional conductive vias 1436 stacked in a corresponding interconnect dielectric layer 1438. These conductive wires and vias 1434, 1436 define conductive paths leading from the third transistors 804.

An additional bond structure 1616 is between the third interconnect structure 1614 and the second semiconductor substrate 1404. Further, the additional bond structure 1616 facilitates bonding of the second and third IC chips 104b, 104c together at an additional bond interface 1618. Such bonding may, for example, include a combination of metal-to-metal bonding and dielectric-to-dielectric bonding at the additional bond interface 1618.

The additional bond structure 1616 comprise additional bond dielectric layers 1620 individual to the second and third IC chips 104b, 104c and directly contacting and bonded together at the additional bond interface 1618. Further, the additional bond structure 1616 comprise additional bond pads 1622 individual to the second and third IC chips 104b, 104c and directly contacting and bonded together at the additional bond interface 1618. The additional bond pads 1622 are inset respectively into the additional bond dielectric layers 1620 and are electrically coupled respectively to the third interconnect structure 1614 and a TSV 1626 by additional bond vias 1624 respectively in the additional bond dielectric layers 1620.

The TSV 1626 extends through the second semiconductor substrate 1404, from the second interconnect structure 1432 to the additional bond structure 1616 to provide electrical coupling therebetween. Further, the TSV 1626 is separated from the second semiconductor substrate 1404 by a TSV dielectric layer 1628.

The third transistors 804 and the third interconnect structure 1614 form an ASIC 802 electrically coupled to the pixel sensor 102 through the additional bond structure 1616 and the TSV 1626. The ASIC 802 may, for example, be configured to perform ADC, buffering, image processing, the like, or any combination of the foregoing on an output of the pixel sensor 102.

Figure 17:
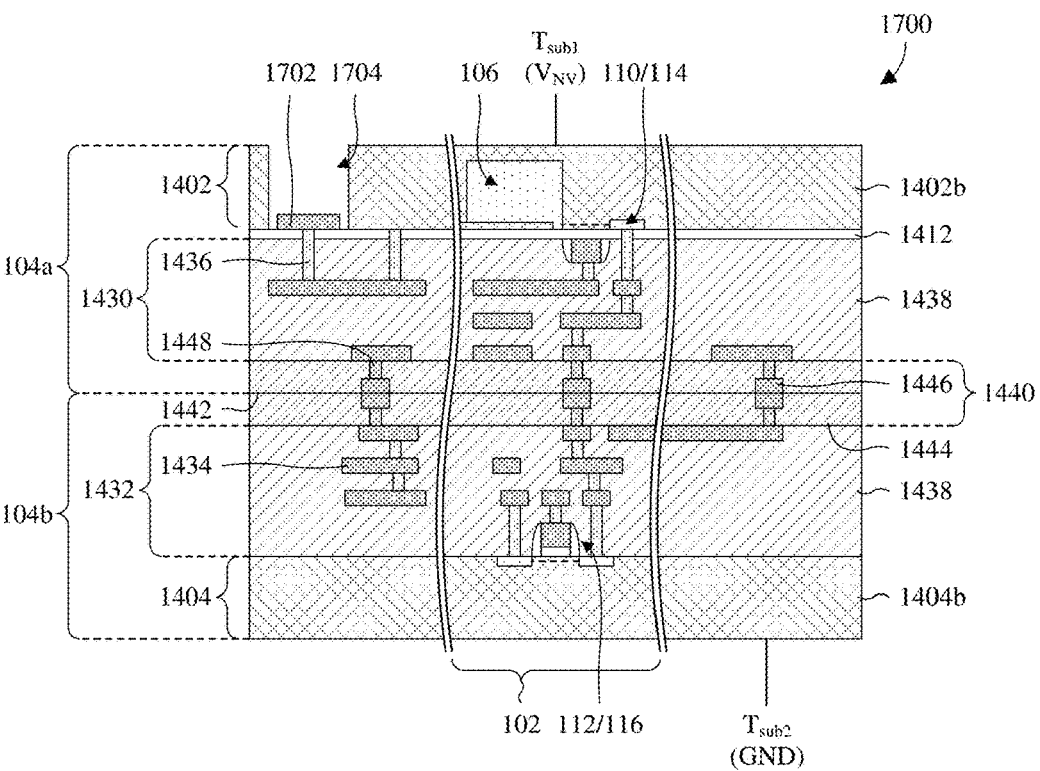
FIG. 17 illustrates a cross-sectional view of some embodiments of the image sensor of FIG. 14 in which the image sensor has a conductive pad at a periphery of a substrate.

With reference to FIG. 17, a cross-sectional view 1700 of some embodiments of the image sensor of FIG. 14 is provided in which the image sensor comprises a conductive pad 1702. The conductive pad 1702 is at a periphery of the image sensor and is exposed from a backside of the first semiconductor substrate 1402 by a pad opening 1704. The conductive pad 1702 is electrically coupled (e.g., shorted) to the bulk 1402b of the first semiconductor substrate 1402 by the first interconnect structure 1430, independent of the second interconnect structure 1432. The electrical coupling enables biasing of the bulk 1402b of the first semiconductor substrate 1402 with the negative voltage $V_{NV}$ from the backside of the first semiconductor substrate 1402.

The second interconnect structure 1432 and the bulk 1404b of the second semiconductor substrate 1404 are electrically isolated from the conductive pad 1702 so as not to be exposed to the higher voltages at the first IC chip 104a. As noted above, the higher voltages result from using the negative voltage $V_{NV}$ at the bulk 1402b of the first semiconductor substrate 1402 to enhance the FWC of the pinned photodiode 106. By isolating the second interconnect structure 1432 from the higher voltages, design constraints may be relaxed and reliability may be enhanced.

During manufacture of the image sensor, the image sensor may be formed in bulk such that multiple instances of the image sensor are concurrently formed on a common wafer. The common wafer may then undergo dicing in which the multiple instances are separated from each other. Such dicing occurs along dicing or scribe lines, which correspond to peripheral or outermost sidewalls of the image sensor illustrated in FIG. 17. Because the peripheral or outermost sidewalls are exposed during and/or after dicing, errant materials (e.g., dust particles) may develop along the peripheral or outermost sidewalls. This may, in turn, cause electrical shorting from the first semiconductor substrate 1402 to the second semiconductor substrate 1404.

As described above, the bulks 1402b, 1404b of the first and second semiconductor substrates 1402, 1404 are electrically isolated from each other and biased respectively with the negative voltage $V_{NV}$ and ground GND to enhance FWC. Because electrical shorting caused by the dicing runs counter to this and may, for example, cause a ground fault, the image sensor may have peripheral isolation at the first semiconductor substrate 1402 as described hereafter.

Figure 18:
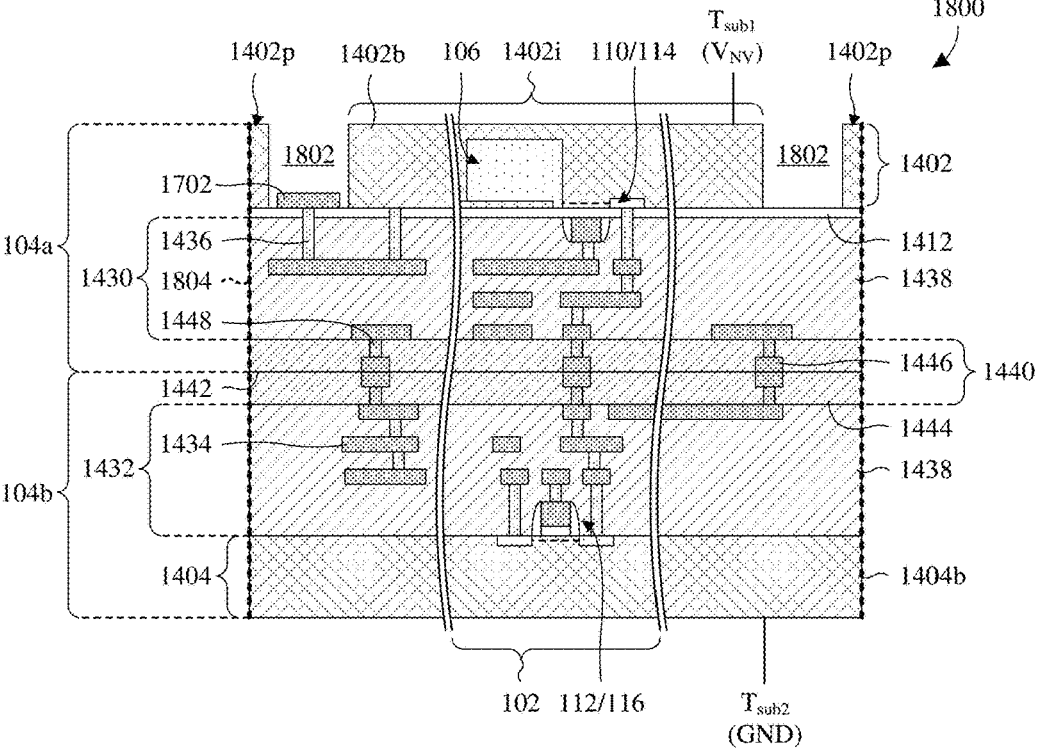
FIG. 18 illustrates a cross-sectional view of some alternative embodiments of the image sensor of FIG. 17 in which the substrate has peripheral isolation.

With reference to FIG. 18, a cross-sectional view 1800 of some alternative embodiments of the image sensor of FIG. 17 is provided in which the first semiconductor substrate 1402 has peripheral isolation. More particularly, an isolation trench 1802 extends completely through the first semiconductor substrate 1402 at a periphery of the first semiconductor substrate 1402 to separate the first semiconductor substrate 1402 into a peripheral portion 1402*p* and an interior portion 1402*i*. Further, the conductive pad 1702 is in the isolation trench 1802, exposed from the backside of the first semiconductor substrate 1402.

The interior portion 1402*i* accommodates the bulk 1402*b* of the first semiconductor substrate 1402, the pinned photodiode 106, and the first transistor 110. Further, the interior portion 1402*i* is surrounded by the peripheral portion 1402*p*, which is physically and electrically isolated from the interior portion 1402*i*. As such, the peripheral portion 1402*p* may be electrically floating or electrically coupled (e.g., shorted) to ground GND, whereas the interior portion 1402*i* may be electrically coupled (e.g., shorted) to the negative voltage $V_{NV}$.

Because the peripheral portion 1402*p* is electrically isolated from the interior portion 1402*i*, it may prevent electrical shorting between the bulks 1402*b*, 1404*b* of the first and second semiconductor substrates 1402, 1404 even if errant materials 1804 (e.g., dust particles) develop along the peripheral or outermost sidewalls of the image sensor during and/or after dicing. Hence, electrical shorting between the negative voltage $V_{NV}$ and ground GND may be prevented.

Figure 19:
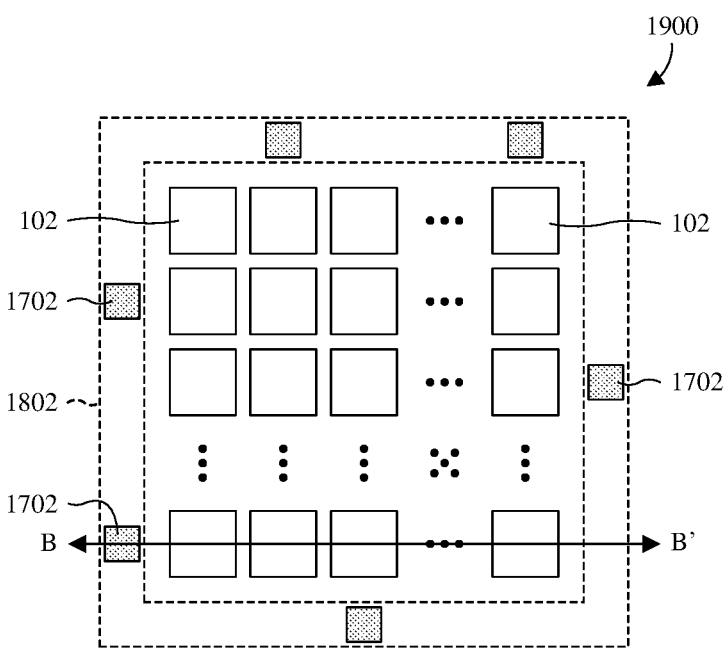
FIG. 19 illustrates a top layout view of some embodiments of the image sensor of FIG. 18.

With reference to FIG. 19, a top layout view 1900 of some embodiments of the image sensor of FIG. 18 is provided. The image sensor comprises a plurality of pixel sensors 102 in a plurality of rows and a plurality or columns, and further comprises a plurality of conductive pads 1702 in the isolation trench 1802 (shown in phantom). Further, the isolation trench 1802 extends in a closed path to completely surround the plurality of pixel sensors 102 and the plurality of conductive pads 1702. The cross-sectional view 1800 of FIG. 18 may, for example, be taken along line B-B' in FIG. 19, and the pixel sensor 102 of FIG. 18 may, for example, correspond to any one of the pixel sensors 102 along line B-B'.

Figure 20A:
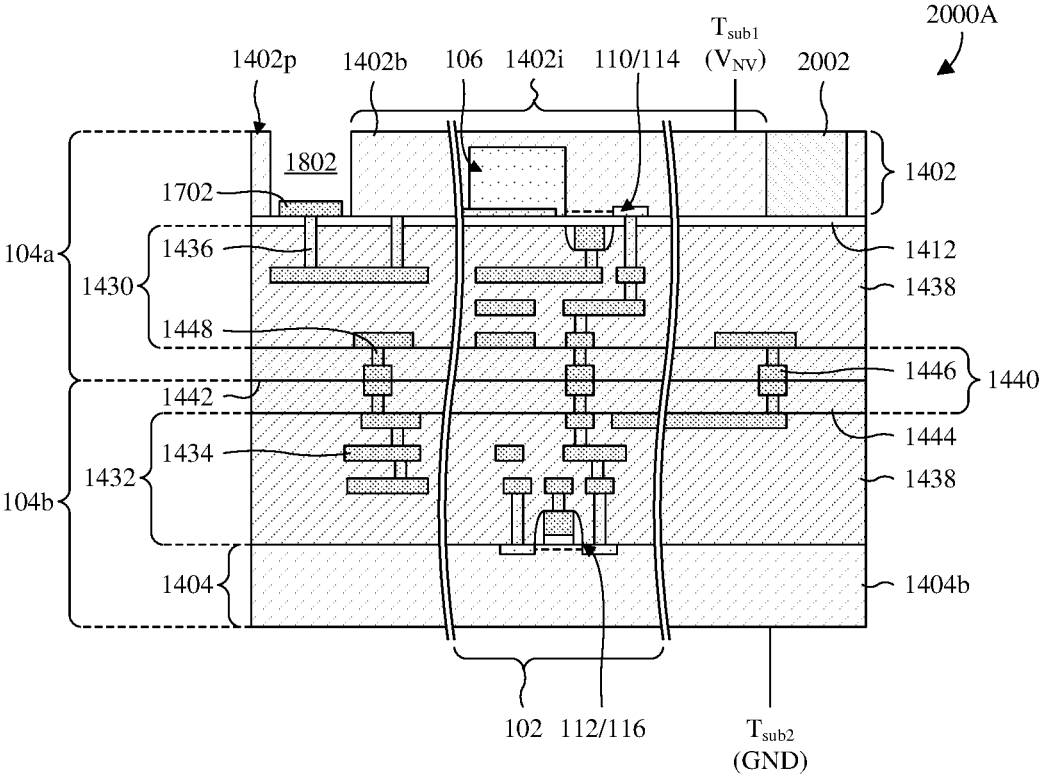
FIGS. 20A-20C illustrate cross-sectional views of some alternative embodiments of the image sensor of FIG. 18.
Figure 20B:
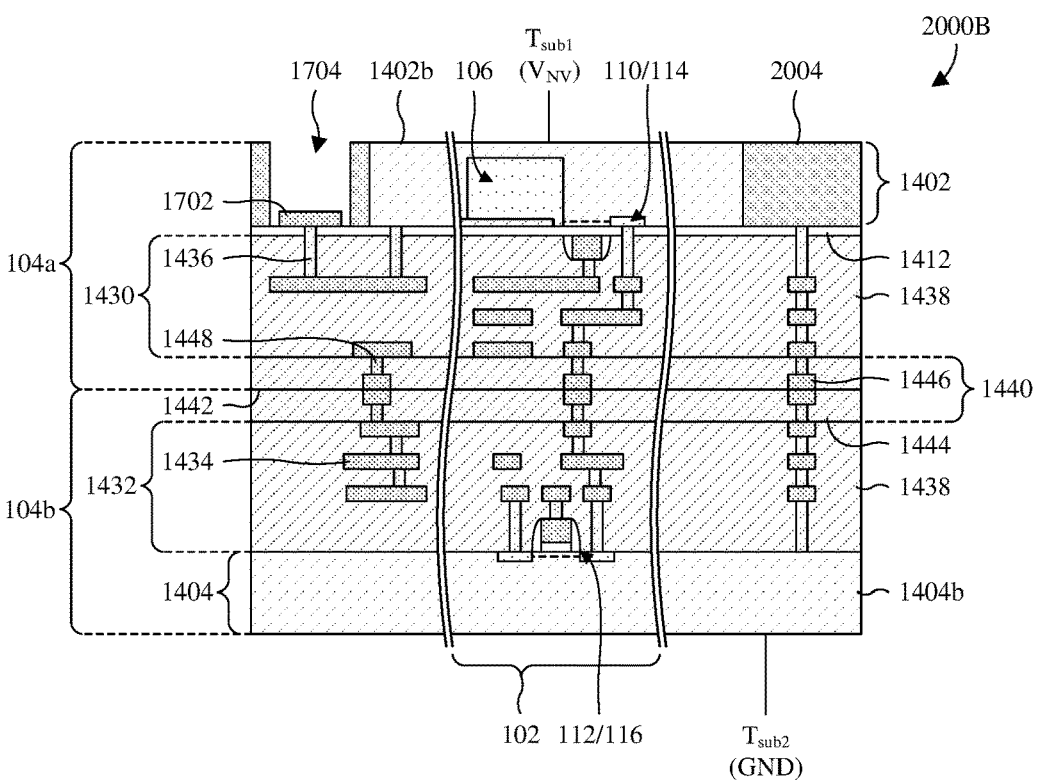
Figure 20C:
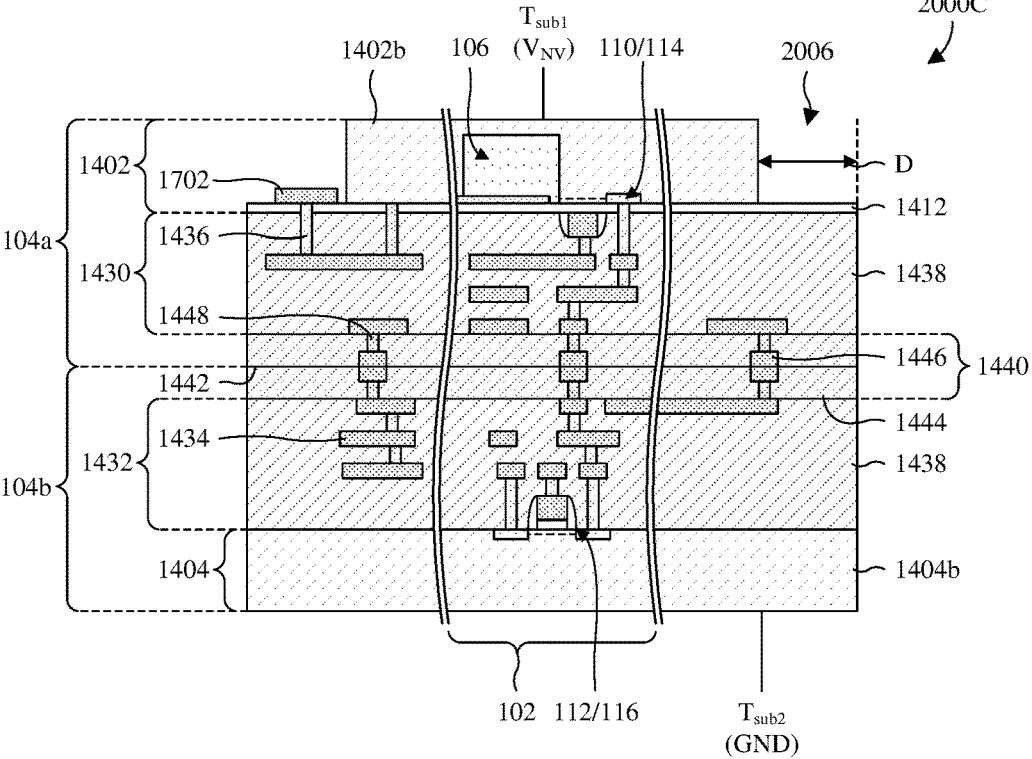

With reference to FIGS. 20A-20C, cross-sectional views 2000A-2000C of some alternative embodiments of the image sensor of FIG. 18 is provided.

At FIG. 20A, the isolation trench 1802 can be partially filled with a trench-fill dielectric layer 2002. For example, the trench-fill dielectric layer 2002 can fill the isolation trench 1802 around the conductive pad 1702 while leaving the conductive pad 1702 exposed. Filling the isolation trench 1802 mitigates concerns of errant materials causing electrical shorting (e.g., between conductive pads) in the isolation trench 1802 during and/or after dicing.

At FIG. 20B, the isolation trench 1802 is replaced with an isolation region 2004 and a pad opening 1704, which extends through the isolation region 2004 to expose the conductive pad 1702. The isolation region 2004 is at peripheral or outermost sidewalls of the first semiconductor substrate 1402 and extends completely through the first semiconductor substrate 1402. Further, the isolation region 2004 corresponds to a doped region of the first semiconductor substrate 1402 having an opposite doping type as the bulk 1402*b* of the first semiconductor substrate 1402. For example, the isolation region 2004 may be n type, whereas the bulk 1402*b* of the first semiconductor substrate 1402 may be p type.

Because of the opposite doping types, the isolation region 2004 and the bulk 1402*b* of the first semiconductor substrate 1402 form a PN junction. The PN junction creates a depletion region that electrically and completely isolates the bulk 1402*b* of the first semiconductor substrate 1402 from peripheral or outmost sidewalls of the first semiconductor substrate

1402. Such isolation, in turn, mitigates concerns regarding electrical shorting between the negative voltage $V_{NV}$ and ground GND during and/or after dicing.

The isolation region 2004 is further electrically coupled (e.g., shorted) to the bulk 1404*b* of the second semiconductor substrate 1404, and is hence further electrically coupled (e.g., shorted) to ground GND, by the first and second interconnect structures 1430, 1432. Electrically coupling the isolation region 2004 to ground GND increases a size of the depletion formed by the PN junction, thereby enhancing isolation. In alterative embodiments, the isolation region 2004 is electrically floating and/or not electrically coupled to any conductive features in the first and second interconnect structures 1430, 1432.

At FIG. 20C, the isolation trench 1802 is replaced with a keep out zone (KOZ) 2006 at which peripheral or outermost sidewalls of the first semiconductor substrate 1402 are laterally offset from peripheral or outermost sidewalls of the first interconnect structure 1430 by a distance D. This reduces the likelihood of errant materials causing electrical shorting from the peripheral or outermost sidewalls of the first semiconductor substrate 1402 to peripheral or outermost sidewalls of the second semiconductor substrate 1404 during and/or after dicing.

Figure 21:
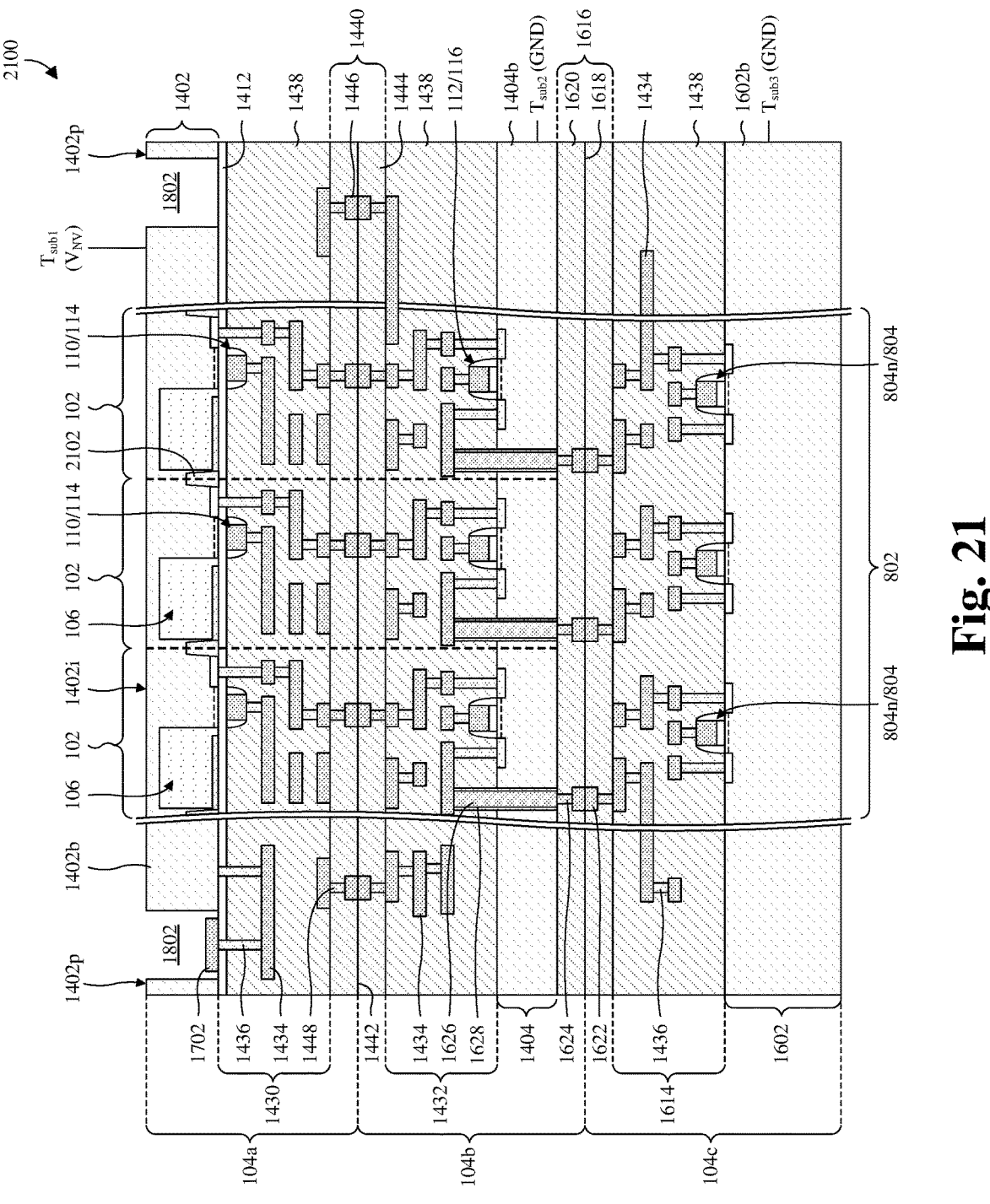
FIG. 21 illustrates a cross-sectional view of some embodiments of the image of FIG. 18 in which the image sensor comprises a plurality of pixel sensors and a third IC chip.

With reference to FIG. 21, a cross-sectional view 2100 of some alternative embodiments of the image of FIG. 18 is provided in which the image sensor comprises a plurality of pixel sensors 102 and a third IC chip 104*c*. The pixel sensors 102 are each as illustrated described with regard to FIG. 16 and are separated from each other by a trench isolation structure 2102 in the first semiconductor substrate 1402. The trench isolation structure 2102 comprises a dielectric material and may, for example, be a shallow trench isolation (STI) structure, a deep trench isolation (DTI) structure, the like, or any combination of the foregoing. In some embodiments, the pixel sensors 102 correspond to the circuit diagram 800 of FIG. 8 or the circuit diagram 1000 of FIG. 10.

With reference to FIGS. 22, 23A, 23B, 24, 25, 26A, 26B, 27A, 27B, 28-30, 31A, 31B, 32A, 32B, and 33, a series of views of some embodiments of a method for forming a stacked CMOS image sensor with high FWC is provided.

As illustrated by the views of FIGS. 22, 23A, 23B, and 24, a first IC chip 104*a* comprising a first portion 102*a* of a pixel sensor is formed. The first portion 102*a* comprises a pinned photodiode 106 and a first transistor 110. Further, an anode of the pinned photodiode 106 and a body of the first transistor 110 are electrically coupled (e.g., shorted) to a first substrate terminal $T_{sub1}$ of the image sensor being formed.

Figure 22:
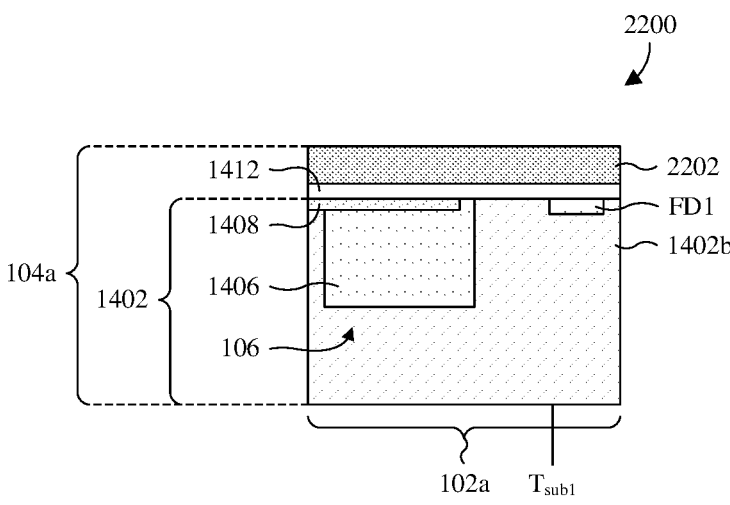
FIGS. 22, 23A, 23B, 24, 25, 26A, 26B, 27A, 27B, 28-30, 31A, 31B, 32A, 32B, and 33 illustrate a series of views of some embodiments of a method for forming a stacked CMOS image sensor with high FWC.

As illustrated by a cross-sectional view 2200 of FIG. 22, the pinned photodiode 106 and a floating diffusion node FD1 are formed in a first semiconductor substrate 1402. A bulk 1402*b* of the first semiconductor substrate 1402 is electrically coupled (e.g., shorted) to the first substrate terminal $T_{sub1}$, and defines or is otherwise electrically coupled (e.g., shorted) to the anode of the pinned photodiode 106. The pinned photodiode 106 and the floating diffusion node FD1 are laterally separated from each other, and the pinned photodiode 106 comprises a collector region 1406 and a pinning region 1408 covering the collector region 1406.

The collector region 1406, the pinning region 1408, and the floating diffusion node FD1 correspond to doped regions of the first semiconductor substrate 1402. The collector region 1406 and the floating diffusion node FD1 share a first common doping type, and the pinning region 1408 and the bulk 1402*b* of the first semiconductor substrate 1402 share a second common doping type opposite the first common doping type. For example, the first common doping type may be n type, whereas the second common doping type may be p type. Further, the pinning region 1408 and the bulk 1402*b* of the first semiconductor substrate 1402 surround the collector region 1406 and the floating diffusion node FD1, such that boundaries of the collector region 1406 and the floating diffusion node FD1 are demarcated by PN junctions.

Also illustrated by the cross-sectional view 2200 of FIG. 22, a first gate dielectric layer 1412 and a first gate electrode layer 2202 are deposited covering the first semiconductor substrate 1402. The first gate dielectric layer 1412 separates the first gate electrode layer 2202 from the first semiconductor substrate 1402. The first gate electrode layer 2202 is conductive and may, for example, be or comprise doped polysilicon, metal, some other suitable conductive material(s), or any combination of the foregoing.

Figure 23A:
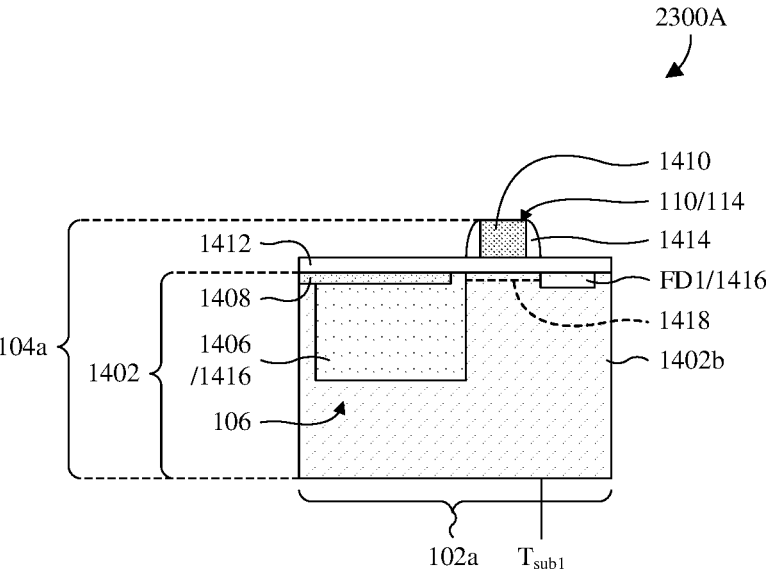
Figure 23B:
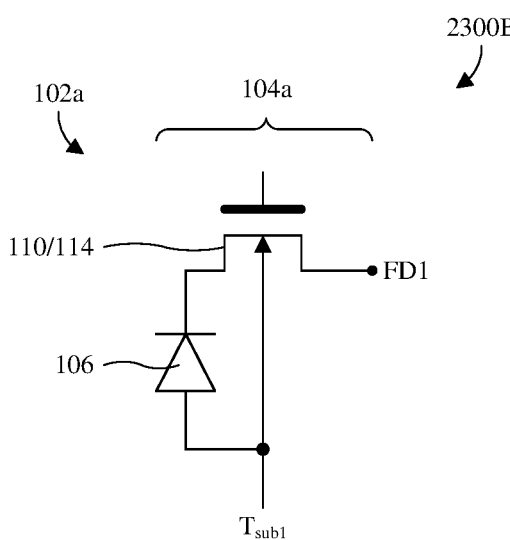

As illustrated by a cross-sectional view 2300A of FIG. 23A, and a circuit diagram 2300B of FIG. 23B, the first gate electrode layer 2202 is patterned to form a first gate electrode 1410. The first gate electrode 1410 is laterally between the collector region 1406 and the floating diffusion node FD1. Further, the first gate electrode 1410 is separated from the first semiconductor substrate 1402 by the first gate dielectric layer 1412, which persists at covering the pinned photodiode 106 after the patterning.

The patterning may, for example, be performed by a photolithography/etching process or some other suitable patterning process. The photolithography/etching process may, for example, comprise forming a mask over the first gate electrode layer 2202 and performing an etch into first gate electrode layer 2202 with the mask in place. The etch is illustrated as stopping before etching into the first gate dielectric layer 1412, but may alternatively etch partially or fully through the first gate dielectric layer 1412.

Also illustrated by the cross-sectional view 2300A of FIG. 23A, a first sidewall spacer 1414 is formed on sidewalls of the first gate electrode 1410 with a pair of segments between which the first gate electrode 1410 is sandwiched. The first sidewall spacer 1414 is dielectric and may, for example, be formed by depositing a dielectric layer on the first gate electrode 1410 and etching back the dielectric layer. Other suitable processes are, however, amenable.

The first gate electrode 1410, the first gate dielectric layer 1412, and the first sidewall spacer 1414, together with the collector region 1406, the floating diffusion node FD1, and the bulk 1402*b* of the first semiconductor substrate 1402, form the first transistor 110. The collector region 1406 and the floating diffusion node FD1 serve as a pair of first source/drain regions 1416 for the first transistor 110. The bulk 1402*b* of the first semiconductor substrate 1402 serves as a body of the first transistor 110. During use of the first transistor 110, a first channel region 1418 separating the collector region 1406 and the floating diffusion node FD1 in the first semiconductor substrate 1402 changes between a non-conductive state and a conductive state depending upon a voltage at the first gate electrode 1410. This allows the selective transfer of charge that accumulates in the collector region 1406 to the floating diffusion node FD1, whereby the first transistor 110 may also be referred to as a transfer transistor 114.

Figure 24:
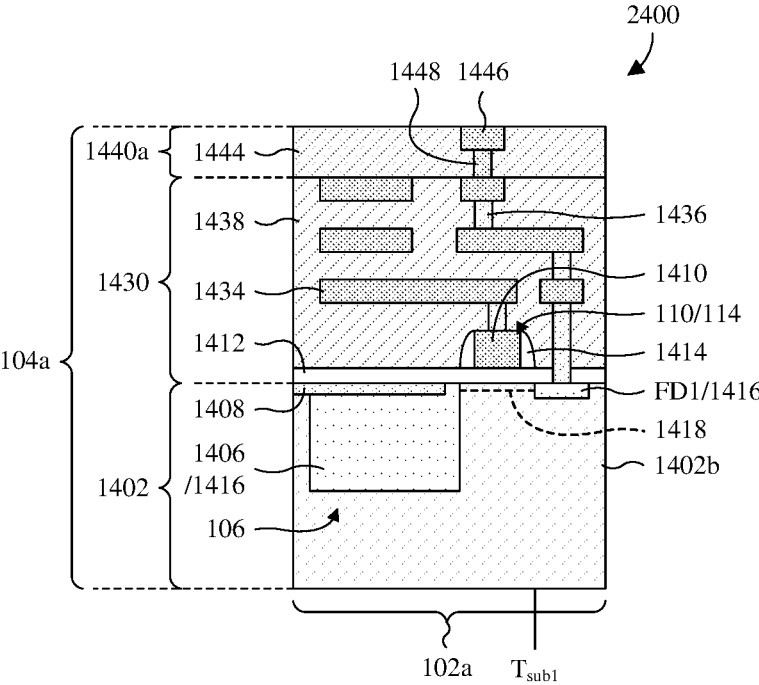

As illustrated by a cross-sectional view 2400 of FIG. 24, a first interconnect structure 1430 is formed over and electrically coupled to the first transistor 110 and the floating diffusion node FD1. The first interconnect structure 1430 comprises a plurality of conductive wires 1434 and a plurality of conductive vias 1436 in an interconnect dielectric layer 1438. The conductive wires 1434 and the conductive vias 1436 are grouped respectively into a plurality of wire levels and a plurality of via levels that are alternatingly stacked to define conductive paths.

Also illustrated by the cross-sectional view 2400 of FIG. 24, a first bond substructure 1440*a* is formed on the first interconnect structure 1430. The first bond substructure 1440*a* comprises a bond pad 1446 and a bond via 1448 in a bond dielectric layer 1444. The bond pad 1446 and the bond dielectric layer 1444 form a common bond surface, and the bond via 1448 extends from the bond pad 1446 to the first interconnect structure 1430.

Figure 25:
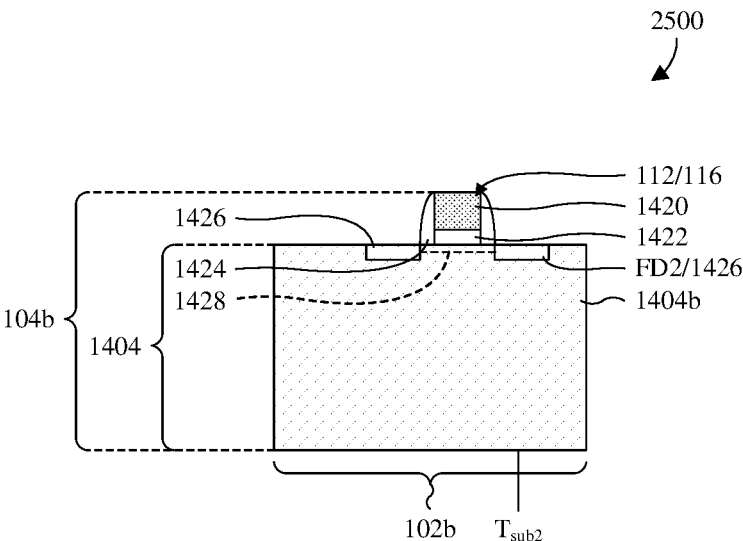
Figure 26A:
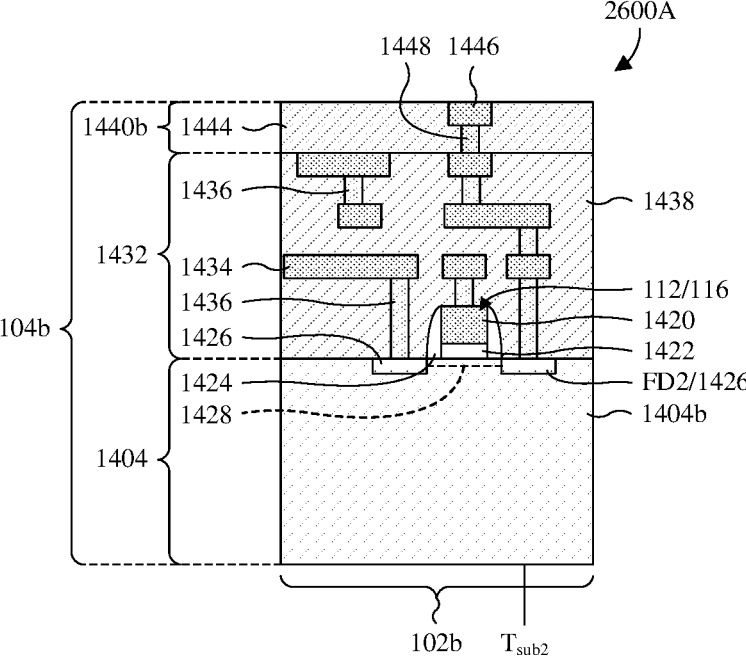
Figure 26B:
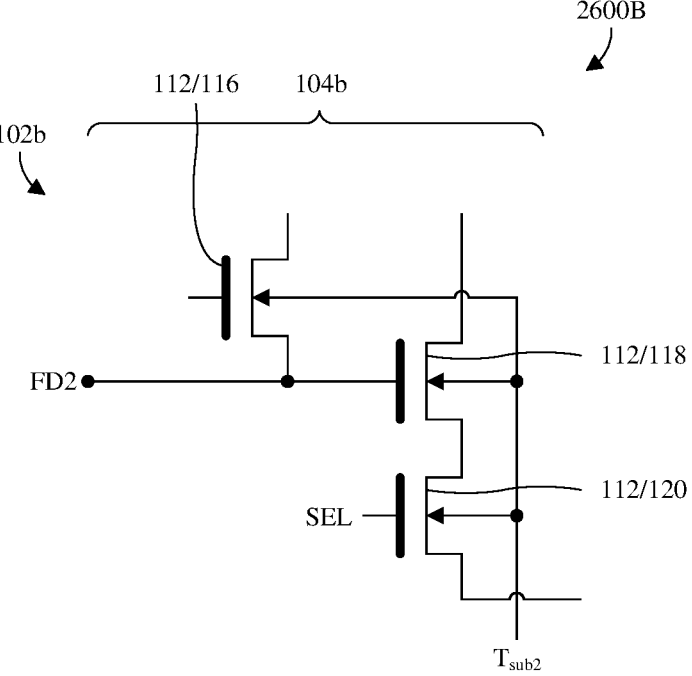

As illustrated by the views of FIGS. 25, 26A, and 26B, a second IC chip 104*b* comprising a second portion 102*b* of the pixel sensor is formed. The second portion 102*b* comprises a plurality of second transistors 112 having individual bodies electrically coupled (e.g., shorted) to a second substrate terminal $T_{sub2}$ of the image sensor being formed.

As illustrated by a cross-sectional view 2500 of FIG. 25, the plurality of second transistors 112 is formed on a second semiconductor substrate 1404. Further, a bulk 1404*b* of the second semiconductor substrate 1404 is electrically coupled (e.g., shorted) to the second substrate terminal $T_{sub2}$, and defines or is electrically coupled (e.g., shorted) to individual bodies of the second transistors 112. Note that only one of the second transistors 112, a reset transistor 116, is shown. However, additional second transistors (e.g., a select transistor and a source-follower transistors) are shown hereafter in FIG. 26B.

The second transistors 112 comprise individual second gate electrodes 1420, individual second gate dielectric layers 1422, individual second sidewall spacers 1424, and individual pairs of second source/drain regions 1426. The second gate electrodes 1420 are stacked respectively with the second gate dielectric layers 1422, which separate the second gate electrodes 1420 from the second semiconductor substrate 1404. The second sidewall spacers 1424 are respectively on sidewalls of the second gate electrodes 1420 and respectively on sidewalls of the second gate dielectric layers 1422.

The pairs of second source/drain regions 1426 are in the second semiconductor substrate 1404, and correspond to doped regions of the second semiconductor substrate 1404 with an opposite doping type as the bulk 1404*b* of the second semiconductor substrate 1404. The source/drain regions of each pair of second source/drain regions 1426 are separated by a second channel region 1428 in the second semiconductor substrate 1404. The second channel region 1428 changes between a non-conductive state and a conductive state depending upon a voltage at a respective one of the second gate electrodes 1420. Further, a source/drain region of the pair of second source/drain regions 1426 of the reset transistor 116 defines a floating diffusion node FD2 of the image sensor being formed.

As illustrated by a cross-sectional view 2600A of FIG. 26A, and a circuit diagram 2600B of FIG. 26B, a second interconnect structure 1432 and a second bond substructure 1440*b* are formed. The second interconnect structure 1432 overlies and is electrically coupled to the second transistors 112. The second bond substructure 1440*b* overlies and is electrically coupled to the second interconnect structure 1432. The second interconnect structure 1432 and the second bond substructure 1440*b* are respectively as the first interconnect structure 1430 and the first bond substructure 1440*a* are described with regard to FIG. 24.

Focusing on the circuit diagram 2600B of FIG. 26B, the plurality of second transistors 112 comprises the reset transistor 116, a source-follower transistor 118, and a select transistor 120 electrically interconnected by the second interconnect structure 1432 (see, e.g., FIG. 26A). The source-follower transistor 118 and the select transistors 120 are electrically coupled in series. Further, the reset transistor 118 has a source/drain region electrically coupled (e.g., electrically shorted) to a gate electrode of the source-follower transistor 118.

Figure 27A:
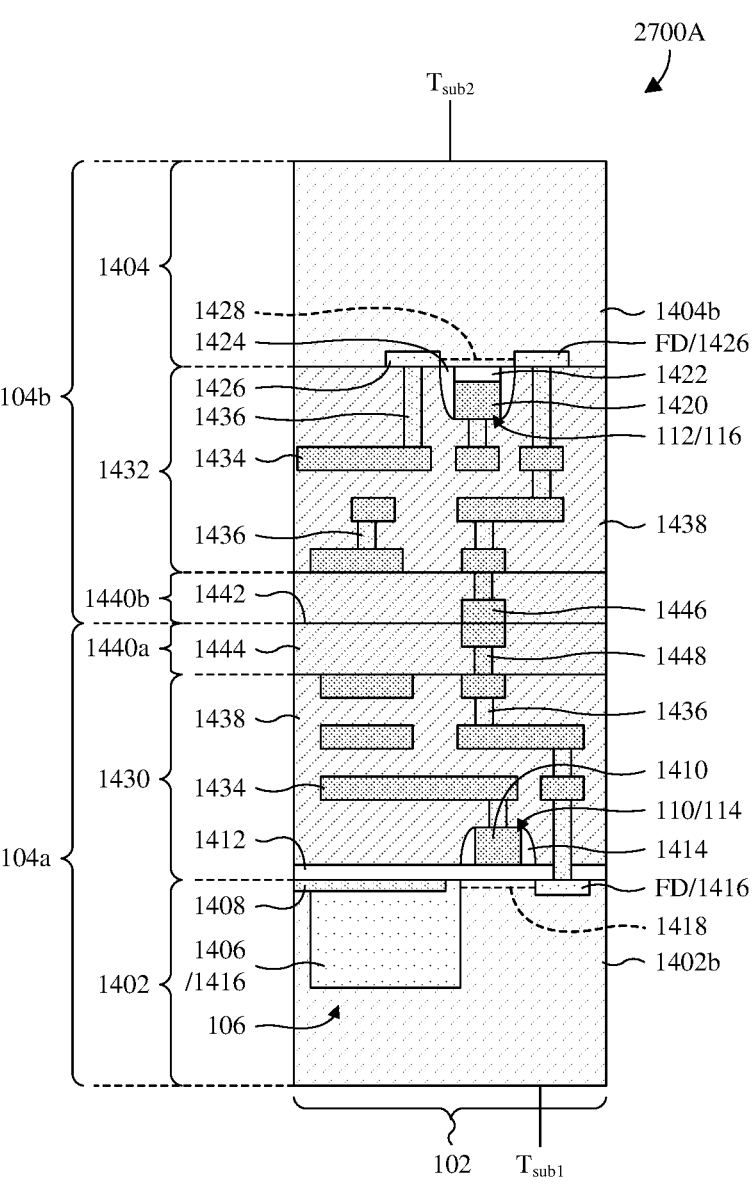
Figure 27B:
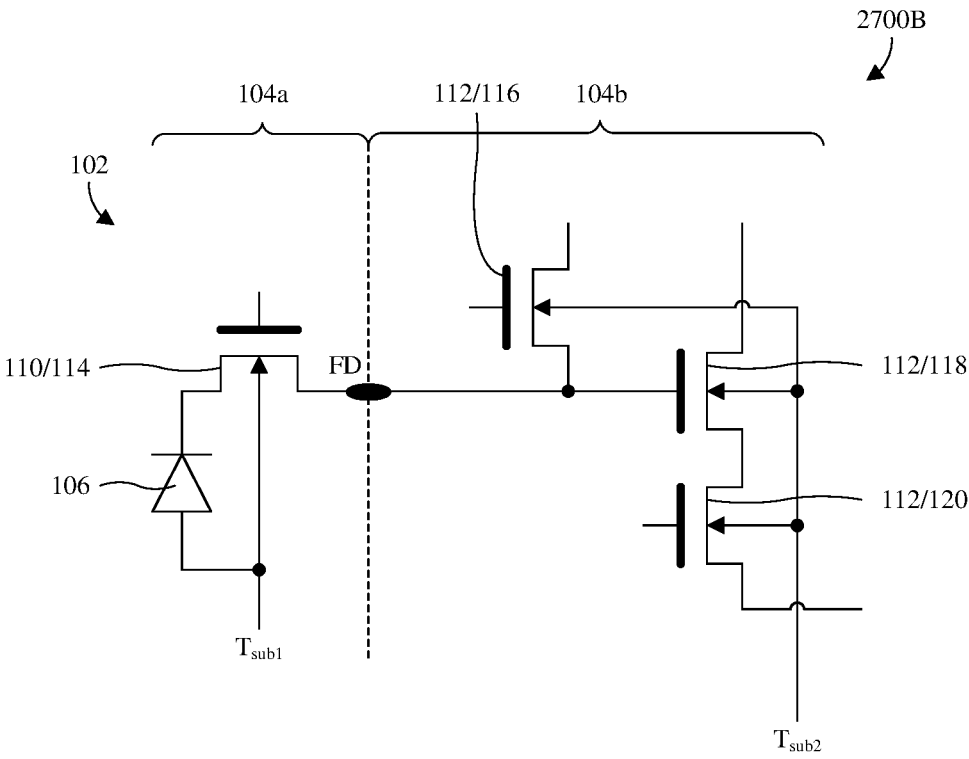

As illustrated by a cross-sectional view 2700A of FIG. 27A, and a circuit diagram 2700B of FIG. 27B, the second IC chip 104*b* of FIGS. 26A and 26B is vertically flipped and is bonded to the first IC chip 104*a* of FIG. 24 at a first bond interface 1442. The bonding comprises both metal-to-metal bonding and dielectric-to-dielectric bonding.

The bonding forms a pixel sensor 102 from the first portion 102*a* of the pixel sensor 102 at FIG. 24 and from the second portion 102*b* of the pixel sensor 102 at FIGS. 26A and 26B, and further electrically couples the floating diffusion nodes FD1, FD2 respectively at the first and second portions 102*a*, 102*b* to form a common floating diffusion node FD straddling the first and second IC chips 104*a*, 104*b*. Further, the bonding is such that the first and second substrate terminals $T_{sub1}$, $T_{sub2}$ are electrically isolated from each other and the bulks 1402*b*, 1404*b* of the first and second semiconductor substrates 1402, 1404 are electrically isolated from each other. As explained hereafter, this allows the first and second substrate terminals $T_{sub1}$, $T_{sub2}$ to be respectively biased at a negative voltage and ground to increase FWC.

Because the pixel sensor 102 is spread across the first and second IC chips 104*a*, 104*b*, the pixel sensor 102 has fewer transistors at the first IC chip 104*a* than it would otherwise have. For example, instead of having four transistors at the first IC chip 104*a*, the pixel sensor 102 may only have one transistor at the first IC chip 104*a*. This, in turn, allows the pixel sensor 102 to be scaled down at the first IC chip 104*a* without scaling down the pinned photodiode 106.

Because the pinned photodiode 106 is relatively large and is at the first IC chip 104*a*, but not at the second IC chip 104*b*, the portion of the pixel sensor 102 at the first IC chip 104*a* may be what limits scaling down of the pixel sensor 102. Hence, scaling down the pixel sensor 102 at the first IC chip 104*a* may have the effect of scaling down an entirety of the pixel sensor 102. Because the pixel sensor 102 may be scaled down without scaling down the pinned photodiode 106, as described above, performance of the pixel sensor 102 may be high even at small sizes.

Figure 28:
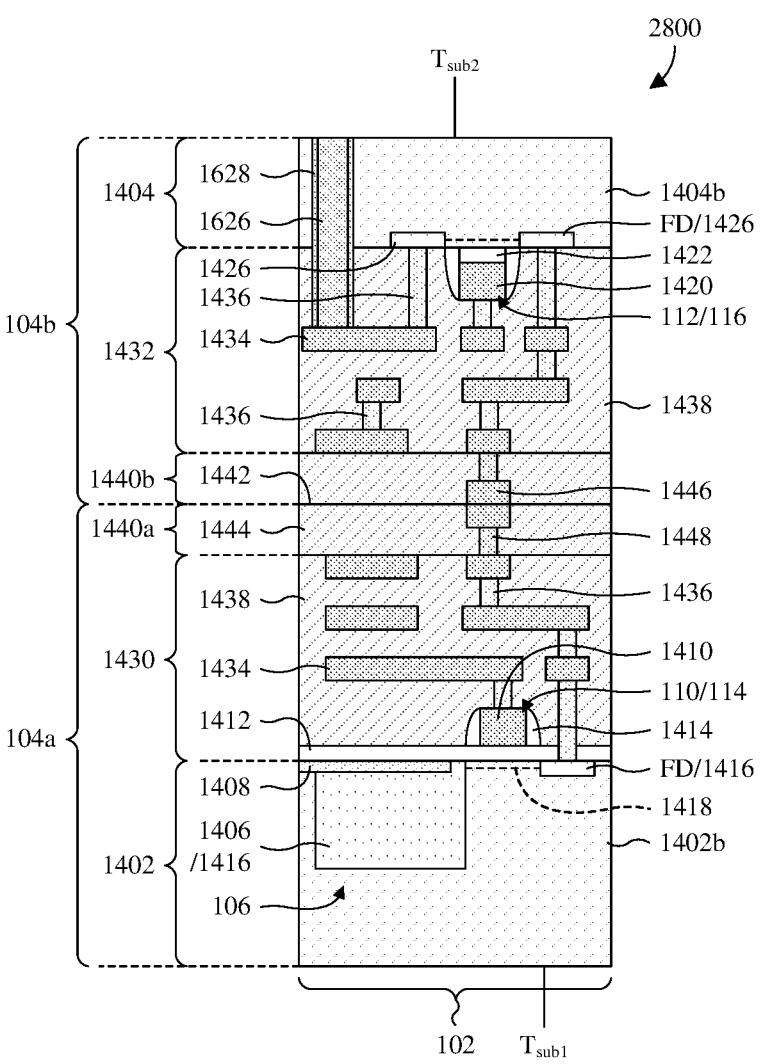

As illustrated by a cross-sectional view 2800 of FIG. 28, the second semiconductor substrate 1404 is thinned from an opposite side of the second semiconductor substrate 1404 as the second interconnect structure 1432 and the second transistors 112. The thinning may, for example, be performed by a chemical mechanical polish (CMP) or the like.

Also illustrated by the cross-sectional view 2800 of FIG. 28, a TSV 1626 is formed extending through the second semiconductor substrate 1404 to the second interconnect structure 1432. Further, the TSV 1626 is formed separated from the second semiconductor substrate 1404 and the interconnect dielectric layer 1438 of the second interconnect structure 1432 by a TSV dielectric layer 1628. The TSV 1626 is conductive to provide electrical coupling to the second interconnect structure 1432 from a backside of the second semiconductor substrate 1404.

Figure 29:
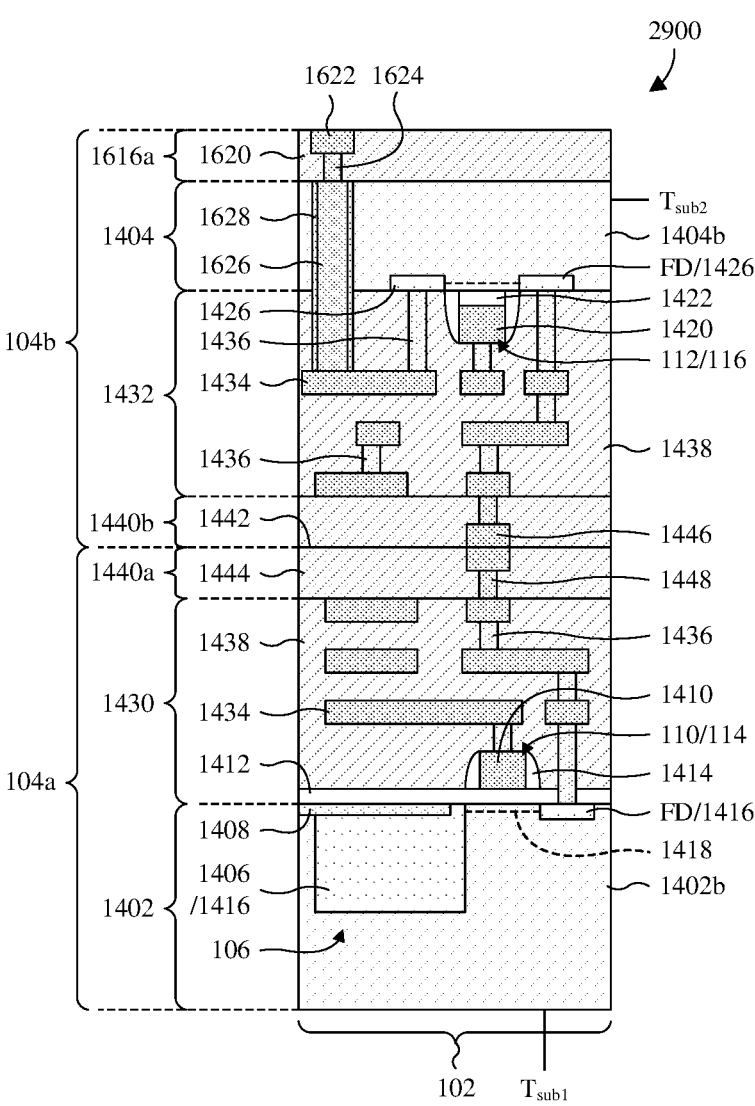

As illustrated by a cross-sectional view 2900 of FIG. 29, a third bond substructure 1616*a* is formed on the backside of the second semiconductor substrate 1404. The third bond substructure 1616*a* comprises a bond pad 1622 and a bond via 1624 in a bond dielectric layer 1620. The bond pad 1622 and the bond dielectric layer 1620 form a common bond surface, and the bond via 1624 extends from the bond pad 1622 to the TSV 1626.

Figure 30:
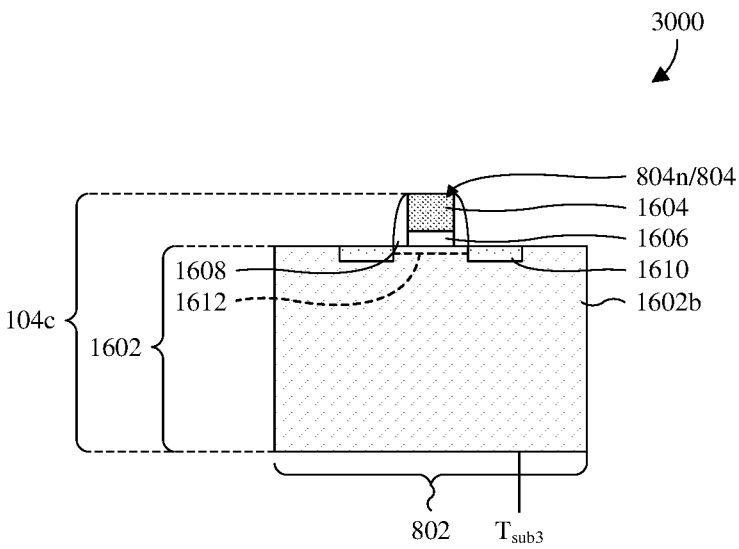
Figure 31A:
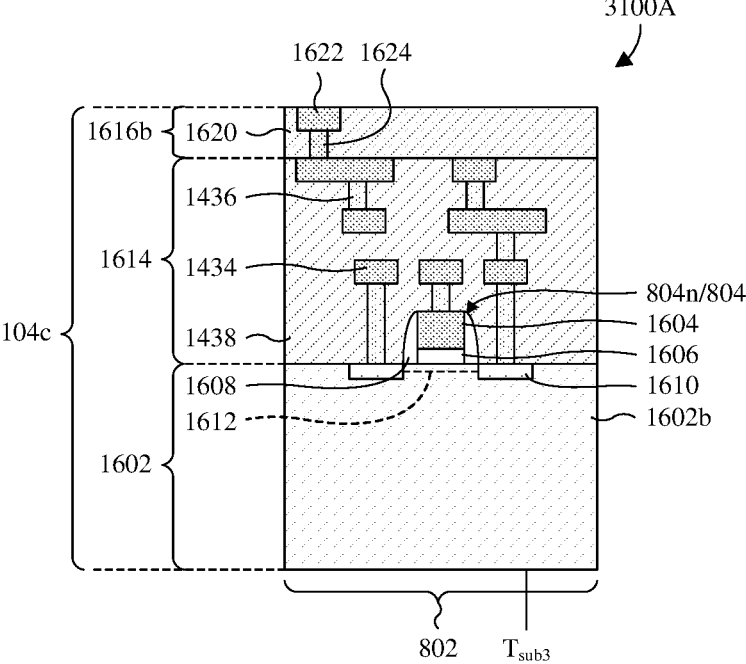
Figure 31B:
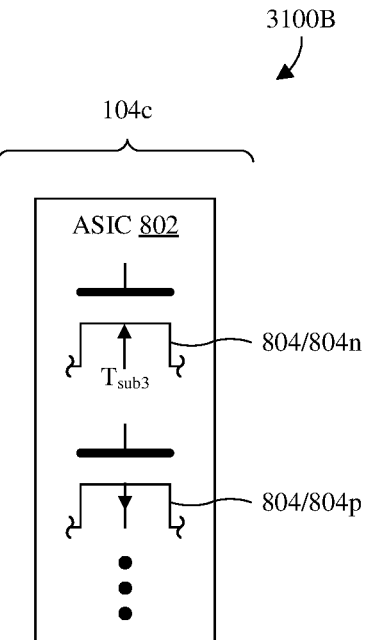

As illustrated by the views of FIGS. 30, 31A, and 31B, a third IC chip 104*c* comprising an ASIC 802 is formed. The ASIC 802 comprises a plurality of third transistors 804 having individual bodies electrically coupled (e.g., shorted) to a third substrate terminal $T_{sub3}$ of the image sensor being formed.

As illustrated by the cross-sectional view 3000 of FIG. 30, the plurality of third transistors 804 is formed on a third semiconductor substrate 1602. Further, a bulk 1602*b* of the third semiconductor substrate 1602 is electrically coupled (e.g., shorted) to the third substrate terminal $T_{sub3}$, and defines or is electrically coupled (e.g., shorted) to individual bodies of at least some of the third transistors 804. For example, the bulk 1602*b* of the third semiconductor substrate 1602 may define or is electrically coupled (e.g., shorted) to n-type transistors 804*n* of the plurality of third transistors 804, but not p-type transistors of the plurality of third transistors 804. Note that only one of the third transistors 804 is shown. However, additional third transistors are shown hereafter in FIG. 31B.

The third transistors 804 comprise individual third gate electrodes 1604, individual third gate dielectric layers 1606, individual third sidewall spacers 1608, and individual pairs of third source/drain regions 1610. The third gate electrodes 1604 are stacked respectively with the third gate dielectric layers 1606, which separate the third gate electrodes 1604 from the third semiconductor substrate 1602. The third sidewall spacers 1608 are on sidewalls respectively of the third gate electrodes 1604 and the third gate dielectric layers 1606.

The pairs of third source/drain regions 1610 are in the third semiconductor substrate 1602, and correspond to doped regions of the third semiconductor substrate 1602 with an opposite doping type as immediately adjoining regions of the third semiconductor substrate 1602. Further, the source/drain regions of each pair of third source/drain regions 1610 are separated by a third channel region 1612 in the third semiconductor substrate 1602. The third channel region 1612 changes between a non-conductive state and a conductive state depending upon a voltage at a respective one of the third gate electrodes 1604.

As illustrated by a cross-sectional view 3100A of FIG. 31A, and a circuit diagram 3100B of FIG. 31B, a third interconnect structure 1614 and a fourth bond substructure 1616*b* are formed. The third interconnect structure 1614 overlies and is electrically coupled to the third transistors 804. Further, the third interconnect structure 1614 is as the first interconnect structure 1430 is described with regard to FIG. 24. The fourth bond substructure 1616*b* overlies and is electrically coupled to the third interconnect structure 1614. Further, the fourth bond substructure 1616*b* is as the third bond substructure 1616*a* is described with regard to FIG. 29.

Focusing on the circuit diagram 3100B of FIG. 31B, the plurality of third transistors 804 comprises at least one n-type transistor 804*n* and at least one p-type transistor 804*p*. Note that the ellipses at the ASIC 802 is used to represent zero or more additional third transistors.

Figure 32A:
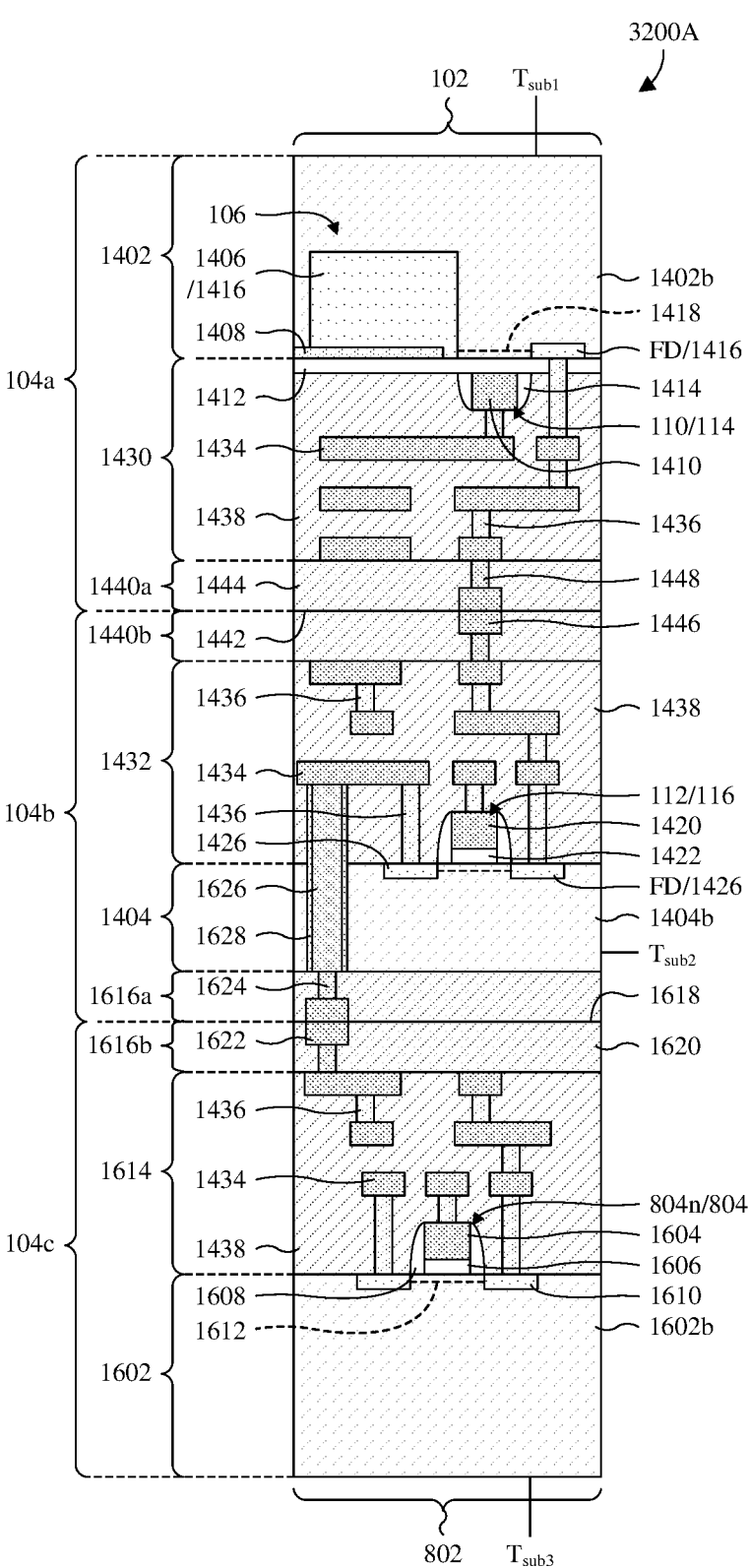
Figure 32B:
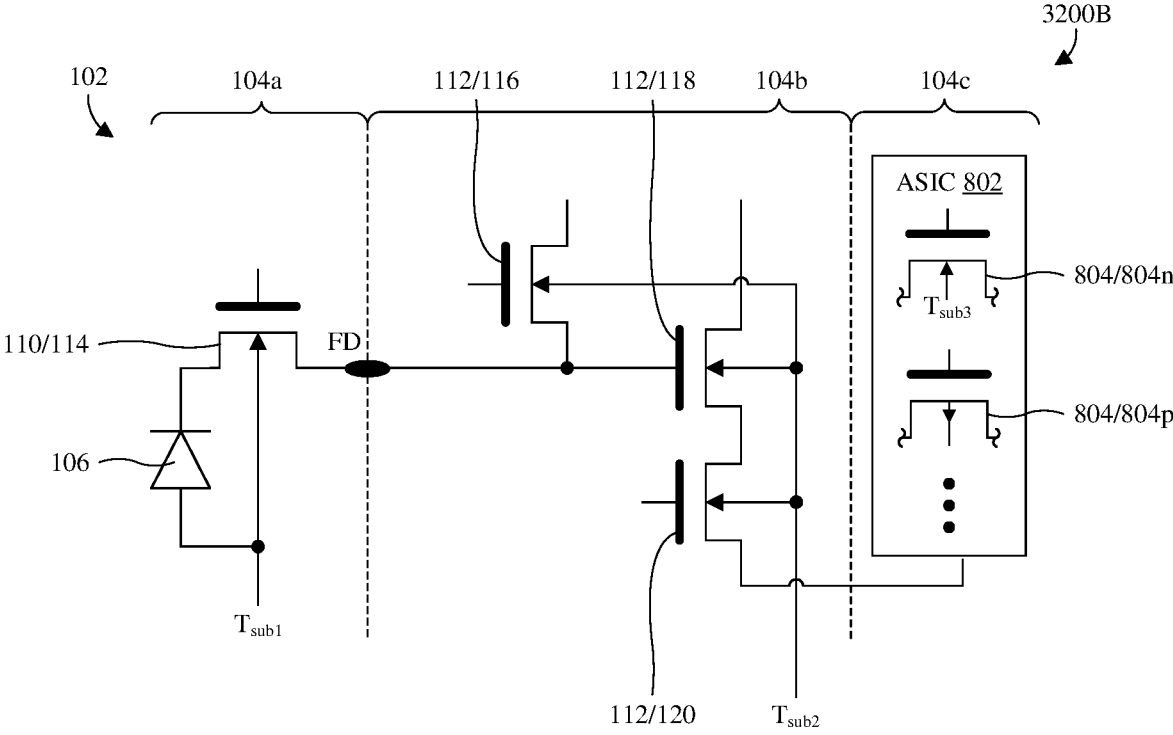

As illustrated by a cross-sectional view 3200A of FIG. 32A, and a circuit diagram 3200B of FIG. 32B, the structure of FIG. 29 is vertically flipped and is bonded to the third IC chip 104*c* of FIGS. 31A and 31B at a second bond interface 1618. The bonding electrically couples the pixel sensor 102 to the ASIC 802 and comprises both metal-to-metal bonding and dielectric-to-dielectric bonding. Further, the bonding is such that the first and third substrate terminals $T_{sub1}$, $T_{sub3}$ are electrically isolated from each other and the bulks 1402*b*, 1602*b* of the first and third semiconductor substrates 1402, 1602 are electrically isolated from each other. In some embodiments, the bonding electrically couples (e.g., shorts) the bulks 1404*b*, 1602*b* of the second and third semiconductor substrates 1404, 1602 together.

Figure 33:
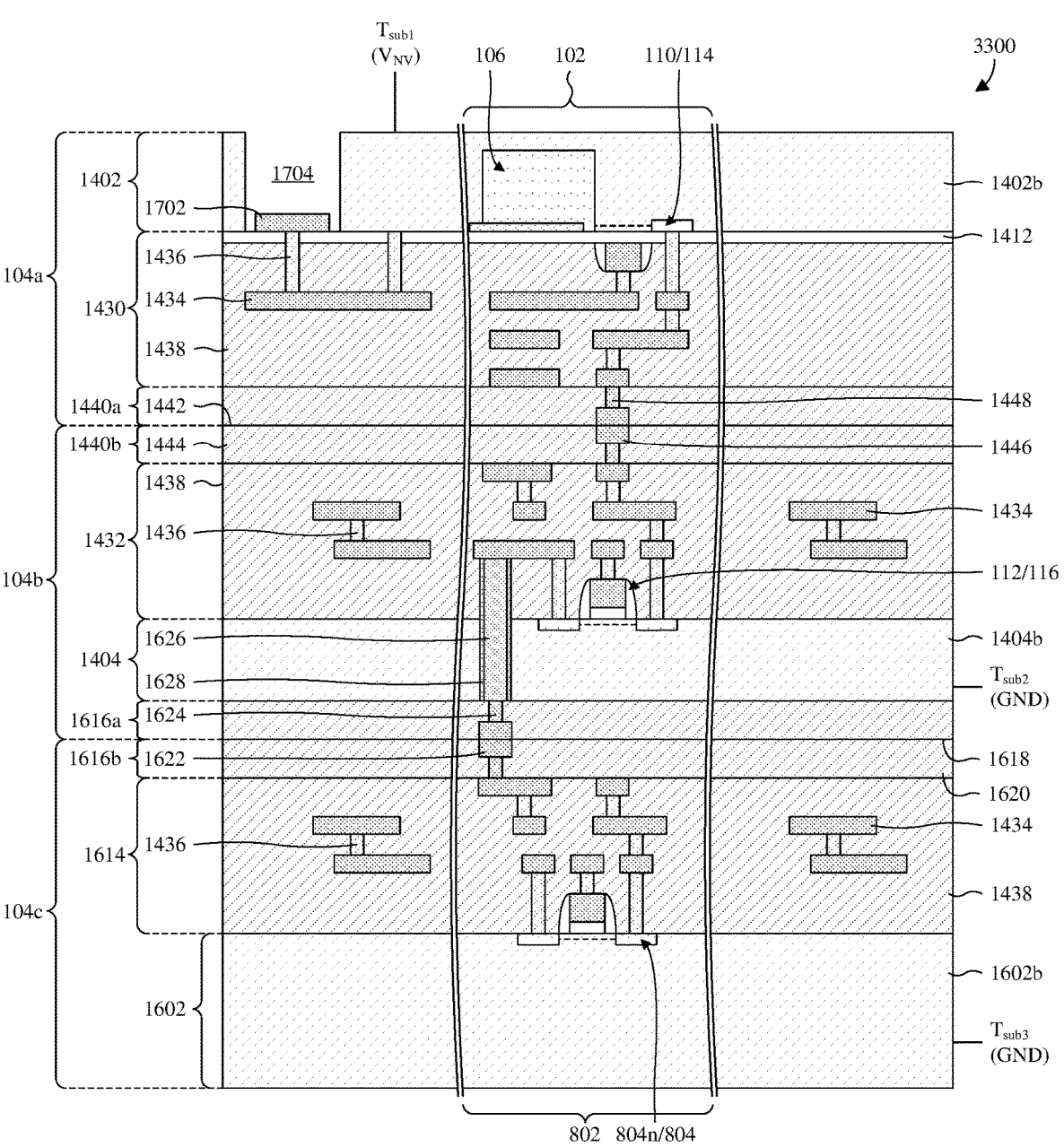

As illustrated by a cross-sectional view 3300 of FIG. 33, the first semiconductor substrate 1402 is thinned from an opposite side of the first semiconductor substrate 1402 as the first interconnect structure 1430 and the first transistor 110. The thinning may, for example, be performed by a CMP or the like.

Also illustrated by the cross-sectional view 3300 of FIG. 33, a pad opening 1704 is formed extending through the first semiconductor substrate 1402 at a periphery of the first semiconductor substrate 1402. Further, a conductive pad 1702 is formed in the pad opening 1704, electrically coupled to the bulk 1402*b* of the first semiconductor substrate 1402 by the first interconnect structure 1430.

During use of the image sensor, the bulk 1402*b* of the first semiconductor substrate 1402 is biased with a negative voltage $V_{NV}$ (e.g., through the first substrate terminal $T_{sub1}$ and/or the conductive pad 1702) and the bulk 1404*b* of the second semiconductor substrate 1404 is biased to ground GND (e.g., through the second substrate terminal $T_{sub2}$). Further, the bulk 1602*b* of the third semiconductor substrate 1602 is biased to ground GND (e.g., through the third substrate terminal $T_{sub3}$). As a result of the biasing, the anode of the pinned photodiode 106 and the body of the first transistor 110 are electrically coupled (e.g., shorted) to the negative voltage $V_{NV}$ at the first IC chip 104*a*. Additionally, the individual bodies of the second transistors 112 are electrically coupled (e.g., shorted) to ground GND at the second IC chip 104*b*.

Because the anode of the pinned photodiode 106 and the body of the transfer transistor 114 are electrically coupled to the negative voltage $V_{NV}$, the pinning voltage of the pinned photodiode 106 and the turn-on voltage of the first transistor 110 are relative to the negative voltage $V_{NV}$ rather than ground GND. This has the effect of increasing these voltages by a magnitude of the negative voltage $V_{NV}$, which increases the FWC of the pinned photodiode 106 and hence enhances performance of the pinned photodiode 106.

Because voltages of the second transistors 112 are relative to ground GND rather than the negative voltage $V_{NV}$, the second transistors 112 are not subjected to the higher voltages that the pinned photodiode 106 and the first transistor 110 are subjected to. As such, endurance and reliability of the second transistors 112 are not impacted by the higher voltages at the pinned photodiode 106 and the first transistor 110. Further, power consumption at the second transistors 112 is not impacted (e.g., increased) by the higher voltages.

While FIGS. 22, 23A, 23B, 24, 25, 26A, 26B, 27A, 27B, 28-30, 31A, 31B, 32A, 32B, and 33 are described with reference to a method, it will be appreciated that the structures shown in these figures are not limited to the method but rather may stand alone separate of the method. While FIGS. 22, 23A, 23B, 24, 25, 26A, 26B, 27A, 27B, 28-30, 31A, 31B, 32A, 32B, and 33 are described as a series of acts, it will be appreciated that the order of the acts may be altered in other embodiments. While FIGS. 22, 23A, 23B, 24, 25, 26A, 26B, 27A, 27B, 28-30, 31A, 31B, 32A, 32B, and 33 illustrate and describe as a specific set of acts, some acts that are illustrated and/or described may be omitted in other embodiments. Further, acts that are not illustrated and/or described may be included in other embodiments.

With reference to FIG. 34, a block diagram 3400 of some embodiments of the method of FIGS. 22, 23A, 23B, 24, 25, 26A, 26B, 27A, 27B, 28-30, 31A, 31B, 32A, 32B, and 33 is provided.

At 3402, a first IC chip comprising a first portion of a pixel sensor is formed. The first portion comprises a pinned photodiode and a first transistor. Further, an anode of the pinned photodiode and a body of the first transistor are electrically coupled together. See, for example, FIGS. 22, 23A, 23B, and 24. Such forming comprises acts 3402*a*-3402*c*. At 3402*a*, the pinned photodiode is formed in a first semiconductor substrate, such that a bulk of the first semiconductor substrate defines or is electrically coupled to the anode of the pinned photodiode. See, for example, FIG. 22. At 3402*b*, the first transistor is formed on the first semiconductor substrate, adjacent to the pinned photodiode, such that the bulk of the first semiconductor substrate defines or is electrically coupled to the body of the first transistor. See, for example, FIGS. 22, 23A, and 23B. At 3402*c*, a first interconnect structure is formed covering and electrically coupled to the first transistor and the pinned photodiode. See, for example, FIG. 24.

At 3404, a second IC chip comprising a second portion of the pixel sensor is formed. The second portion comprises a plurality of second transistors with individual bodies electrically coupled together. See, for example, FIGS. 25, 26A, and 26B. Such forming comprises acts 3404*a* and 3404*b*. At 3404*a*, the second transistors are formed on a second semiconductor substrate, such that a bulk of the second semiconductor substrate defines or is electrically coupled to individual bodies of the second transistors. See, for example, FIG. 25. At 3404*b*, a second interconnect structure is formed covering and electrically coupled to the second transistors. See, for example, FIGS. 26A and 26B.

At 3406, the first and second IC chips are bonded together at a first bond interface. The bulks of the first and second semiconductor substrates are electrically isolated from each other upon completion of the bonding. See, for example, FIGS. 27A and 27B.

At 3408, a TSV is formed extending through the second semiconductor substrate to the second interconnect structure. See, for example, FIG. 28.

At 3410, a bond substructure is formed covering and electrically coupled to the TSV on an opposite side of the second semiconductor substrate as the second interconnect structure. See, for example, FIG. 29.

At 3412, a third IC chip comprising an ASIC is formed. The ASIC comprises a plurality of third transistors on a third semiconductor substrate, and a bulk of the third semiconductor substrate defines or is electrically coupled to individual bodies of at least some of the third transistors. See, for example, FIGS. 30, 31A, and 31B.

At 3414, the second and third IC chips are bonded together at a second bond interface. See, for example, FIGS. 32A and 32B.

At 3416, a pad electrically coupled to the bulk of the first semiconductor substrate, and exposed through a pad opening in the first semiconductor substrate, is formed. See, for example, FIG. 33.

While the block diagram 3400 of FIG. 34 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

During manufacture of the image sensor, the image sensor may be formed in bulk such that multiple instances of the image sensor are concurrently formed on a common wafer. The common wafer may then undergo dicing in which the multiple instances are separated from each other. Such dicing occurs along dicing or scribe lines, which correspond to peripheral or outermost sidewalls of the image sensor illustrated in FIG. 33. Because the peripheral or outermost sidewalls are exposed during and/or after dicing, errant materials (e.g., dust particles) may develop along the peripheral or outermost sidewalls. This may, in turn, cause electrical shorting from the first semiconductor substrate 1402 to the second semiconductor substrate 1404.

As described above, the bulks 1402b, 1404b of the first and second semiconductor substrates 1402, 1404 are electrically isolated from each other and biased respectively with the negative voltage $V_{NV}$ and ground GND to enhance FWC. Because electrical shorting caused by the dicing runs counter to this and may, for example, cause a ground fault, the image sensor may have peripheral isolation at the first semiconductor substrate 1402.

Figure 35:
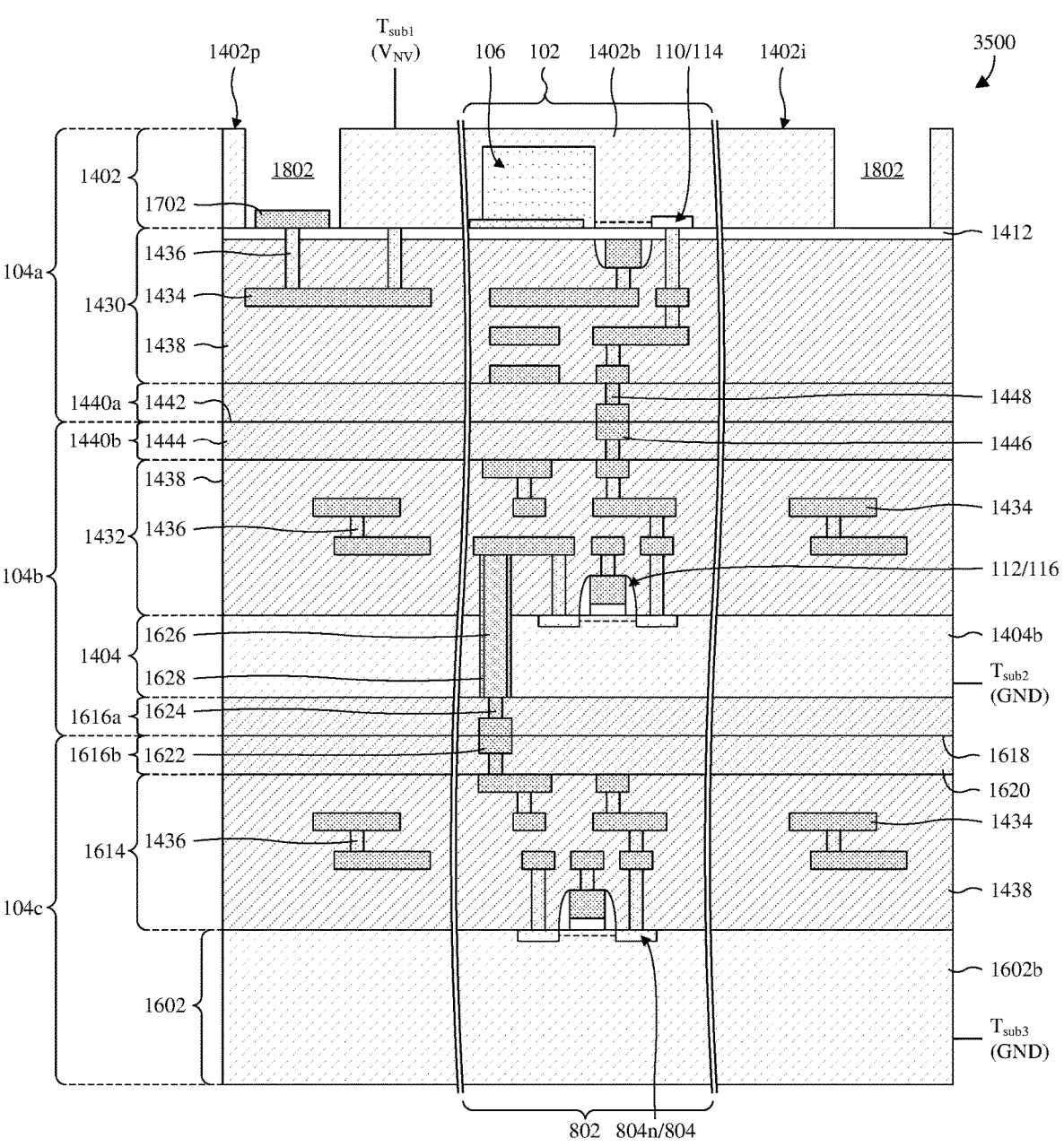
FIGS. 35-37 illustrate cross-sectional views of some alternative embodiments of acts described with regard to FIG. 33.
Figure 36:
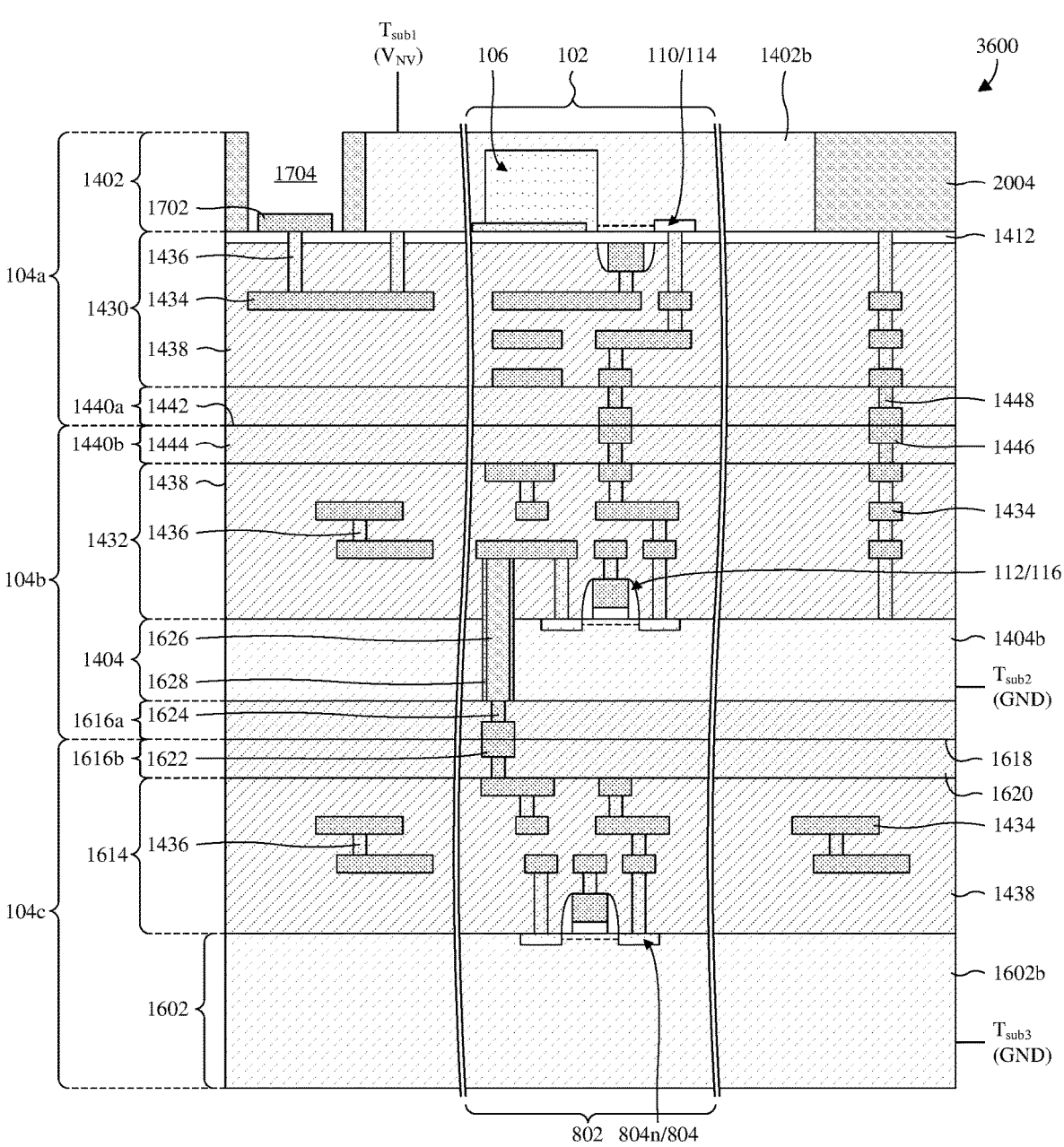
Figure 37:
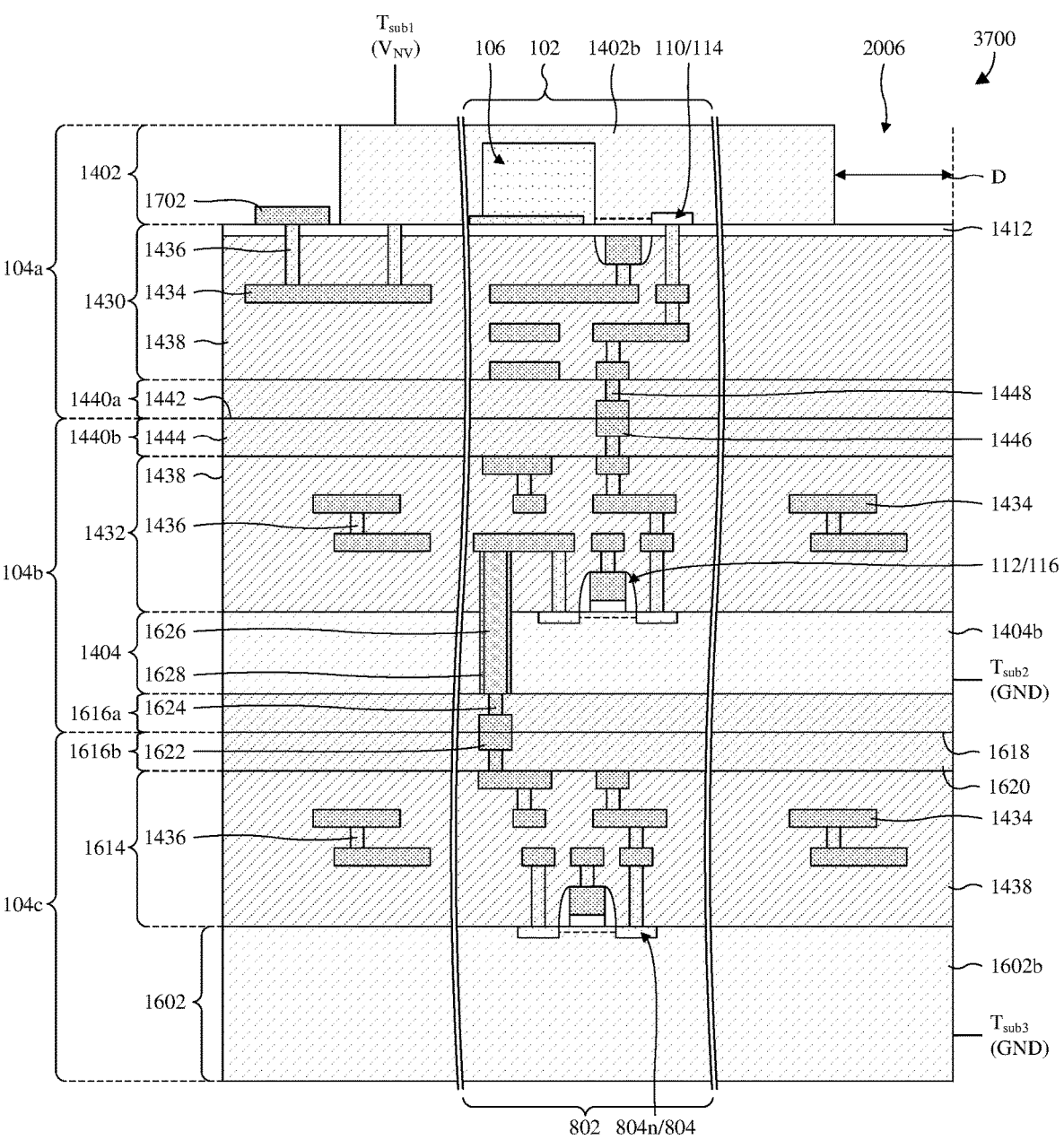

With reference to FIGS. 35-37, cross-sectional views 3500-3700 of some alternative embodiments of the acts described with regard to FIG. 33 are provided in which peripheral isolation mitigates concerns of electrical shorting between the first and second semiconductor substrates 1402, 1404 during and/or after dicing.

At FIG. 35, an isolation trench 1802 may be formed instead of forming the pad opening 1704, and the conductive pad 1702 may be formed in the isolation trench 1802. The isolation trench 1802, like the pad opening 1704, may, for example, be formed by a photolithography/etching process or some other suitable patterning process. The isolation trench 1802 extends completely through the first semiconductor substrate 1402, and further extends in a closed path along a periphery of the first semiconductor substrate 1402. As such, the isolation trench 1802 both physically and electrically separates the first semiconductor substrate 1402 into a peripheral portion 1402p and an interior portion 1402i. A top layout of the isolation trench 1802 may, for example, be as in FIG. 19, and/or FIG. 35 may be taken along line B-B' in FIG. 19.

Because of the isolation, any errant materials that develop on the peripheral or outermost sidewalls of the image sensor (which correspond to sidewalls of the peripheral portion 1402p) during dicing and/or after dicing are electrically separated from the interior portion 1402i, which accommodates the bulk 1402b of the first semiconductor substrate 1402.

At FIG. 36, an isolation region 2004 is formed extending completely through the first semiconductor substrate 1402, and is further formed extending in a closed path along a periphery of the first semiconductor substrate 1402. The isolation region 2004 corresponds to a doped region of the first semiconductor substrate 1402 and has an opposite doping type as the bulk 1402b of the first semiconductor substrate 1402. As such, the isolation region 2004 and the bulk 1402b of the first semiconductor substrate 1402 form a PN junction with a depletion region that electrically isolates peripheral or outermost sidewalls of the first semiconductor substrate 1402 from the bulk 1402b of the first semiconductor substrate 1402. The isolation region 2004 may, for example, be formed by ion implantation or some other suitable doping process.

In some embodiments, the first and second interconnect structures 1430, 1432 and the first and second bond substructures 1440a, 1440b are further formed electrically coupling the isolation region 2004 to the bulk 1404b of the second semiconductor substrate 1404. During use of the image sensor, this leads to electrical coupling of the isolation region 2004 ground GND, which may, for example, increase the size of the depletion region at the PN junction.

At FIG. 37, a KOZ 2006 is formed instead of forming the pad opening 1704, and the conductive pad 1702 may be formed at the KOZ 2006. The KOZ 2006 corresponds a region at which peripheral or outermost sidewalls of the first semiconductor substrate 1402 are offset from peripheral or outermost sidewalls of the second semiconductor substrate 1404 by a distance D. This reduces the likelihood of errant materials electrically shorting the first and second semiconductor substrates 1402, 1404 during and/or after dicing. The KOZ 2006 may, for example, be formed by a photolithography/etching process or some other suitable patterning process.

In some embodiments, the present disclosure provides an image sensor including: a first IC chip including a first semiconductor substrate; a second IC chip stacked with the first IC chip and including a second semiconductor substrate; and a pixel sensor spanning the first and second IC chips, wherein the pixel sensor includes a first transistor and a photodetector at the first semiconductor substrate, and further includes a second transistor at the second semiconductor substrate; wherein a bulk of the first semiconductor substrate and a bulk of the second semiconductor substrate are electrically isolated from each other and are configured to be biased with different voltages. In some embodiments, a body of the first transistor is defined by the bulk of the first semiconductor substrate, wherein a body of the second transistor is defined by the bulk of the second semiconductor substrate. In some embodiments, the first semiconductor substrate overlies the second semiconductor substrate, wherein the image sensor further includes: a pad exposed from over the first semiconductor substrate, wherein the pad is electrically coupled to the bulk of the first semiconductor substrate. In some embodiments, the first transistor includes a gate dielectric layer with a first thickness, wherein the second transistor include a gate dielectric layer with a second thickness less than the first thickness. In some embodiments, the first transistor includes a first gate stack and a first sidewall spacer on a sidewall of the first gate stack, wherein the second transistor includes a second gate stack and a second sidewall spacer on a sidewall of the second gate stack, and wherein a thickness of the second sidewall spacer is less than a thickness of the first sidewall spacer. In some embodiments, the pixel sensor is a 4T APS. In some embodiments, the pixel sensor repeats in a plurality of rows and a plurality of columns, wherein repetitions of the pixel sensor are non-overlapping.

In some embodiments, the present disclosure provides another an image sensor including: a first substrate; a photodiode and a first transistor adjoining on the first substrate; a second substrate underlying the first substrate; and a second transistor on the second substrate; wherein the photodiode and the first and second transistors form a pixel sensor, and wherein a body of the first transistor and an anode of the photodiode are electrically coupled together and are electrically isolated from a body of the second transistor. In some embodiments, the body of the second transistor and the body of the first transistor are configured so as to be concurrently biased respectively to ground and a negative voltage. In some embodiments, the image sensor further includes: an interconnect structure between the first and second substrates; and a pad at a periphery of the first substrate and electrically coupled to the anode of the photodiode by the interconnect structure. In some embodiments, a trench extends laterally along a periphery of the first substrate in a closed path surrounding the photodiode and the first transistor, and further extends vertically through the first substrate, to separate the first substrate into an interior portion and a peripheral portion that are electrically isolated from each other. In some embodiments, the first and second substrates have individual sidewalls extending in individual closed paths respectively around the first and second substrates, wherein the individual sidewall of the first substrate is laterally offset from and surrounded by the individual sidewall of the second substrate when viewed top down. In some embodiments, the first substrate includes a semiconductor material and has a PN junction, wherein the PN junction extends laterally along a periphery of the first substrate in a closed path surrounding the photodiode and the first transistor, and further extends vertically through the first substrate, to electrically isolate an interior portion the first substrate from outermost sidewalls of the first substrate. In some embodiments, the image sensor further includes: a third substrate stacked with the first and second substrates, such that the second substrate is between and spaced from the first and third substrates; and a plurality of third transistors on the third substrate; wherein the third transistors form an ASIC electrically coupled to the pixel sensor.

In some embodiments, the present disclosure provides a method for forming an image sensor, the method including: forming a first IC chip, including: forming a photodiode in a first semiconductor substrate; forming a first transistor on the first semiconductor substrate, adjacent to the photodiode, the photodiode and the first transistor forming a first pixel-sensor portion; forming a second IC chip, wherein the forming of the second IC chip includes forming a plurality of second transistors on a second semiconductor substrate, and wherein the second transistors form a second pixel-sensor portion; and bonding the first and second IC chips together such that the first and second pixel-sensor portions are stacked and electrically coupled together to form a pixel sensor; wherein a bulk of the first semiconductor substrate and a bulk of the second semiconductor substrate are electrically isolated from each other at completion of the bonding. In some embodiments, the forming of the first IC chip further includes forming a first interconnect structure covering the first transistor, and wherein the method further includes: forming a pad at a periphery of the first semiconductor substrate after the bonding and electrically coupled to the first interconnect structure, wherein the first interconnect structure electrically couples the pad to the bulk of the first semiconductor substrate. In some embodiments, the method further includes: patterning the first semiconductor substrate to form a trench extending laterally along the periphery of the first semiconductor substrate in a closed path surrounding the photodiode and the first transistor, and further extending vertically through the first semiconductor substrate, to separate the first semiconductor substrate into an interior portion and a peripheral portion that are electrically isolated from each other, and wherein the pad is formed in the trench. In some embodiments, an anode of the photodiode and a body of the first transistor are electrically isolated from individual bodies of the second transistors at completion of the bonding. In some embodiments, the bonding includes both metal-to-metal bonding and dielectric-to-dielectric bonding. In some embodiments, the method further includes: forming a third IC chip, wherein the third IC chip includes: forming a plurality of third transistors on a third semiconductor substrate; and forming a third interconnect structure covering the third transistors, wherein the third transistors and the third interconnect structure form an ASIC; and bonding the second and third IC chips together, such that the second IC chip is between the first and third IC chips and such that the ASIC is electrically coupled to the pixel sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:

forming a first integrated circuit (IC) chip, comprising:
   forming a photodiode in a first semiconductor substrate;
   forming a first transistor on the first semiconductor substrate, adjacent to the photodiode, the photodiode and the first transistor forming a first pixel-sensor portion; and
   forming a first interconnect structure covering the first transistor;

forming a second IC chip, wherein the forming of the second IC chip comprises forming a plurality of second transistors on a second semiconductor substrate, and wherein the second transistors comprise a source-follower transistor and form a second pixel-sensor portion;

bonding the first and second IC chips together such that the first and second pixel-sensor portions are stacked and electrically coupled together to form a pixel sensor;

patterning the first semiconductor substrate to form a trench extending laterally along a periphery of the first semiconductor substrate in a closed path surrounding the photodiode and the first transistor, and further extending vertically through the first semiconductor substrate, to separate the first semiconductor substrate into an interior portion and a peripheral portion that are electrically isolated from each other; and forming a pad at the periphery of the first semiconductor substrate, and in the trench, after the bonding;

wherein the first interconnect structure electrically couples the pad to a bulk of the first semiconductor substrate, wherein the bulk of the first semiconductor substrate and a bulk of the second semiconductor substrate are electrically isolated from each other at completion of the bonding, wherein a gate electrode of the source-follower transistor is electrically coupled to a source/drain region of the first transistor at completion of the bonding, wherein the trench exposes a dielectric layer, which separates a gate electrode of the first transistor from the first semiconductor substrate, and wherein a thickness of the dielectric layer at the pad is the same as a separation between the gate electrode of the first transistor and the first semiconductor substrate.

2. The method according to claim 1, wherein an anode of the photodiode and a body of the first transistor are not electrically coupled to individual bodies of the second transistors at completion of the bonding.

3. The method according to claim 1, wherein the source-follower transistor and the first transistor are configured to concurrently and respectively receive a first transistor-body voltage and a second transistor-body voltage, and wherein the first and second transistor-body voltages are different.

4. The method according to claim 1, wherein errant particles extend from the second semiconductor substrate to the peripheral portion of the first semiconductor substrate to electrically short the second semiconductor substrate to the peripheral portion.

5. The method according to claim 4, further comprising:
    forming a third IC chip, wherein the third IC chip comprises:
        forming a plurality of third transistors on a third semiconductor substrate; and
        forming a third interconnect structure covering the third transistors, wherein the third transistors and the third interconnect structure form an application-specific integrated circuit (ASIC); and
    bonding the second and third IC chips together, such that the second IC chip is between the first and third IC chips and such that the ASIC is electrically coupled to the pixel sensor.

6. The method according to claim 1, wherein the bonding comprises both metal-to-metal bonding and dielectric-to-dielectric bonding.

7. The method according to claim 1, wherein an anode of the photodiode is electrically coupled to a body of the first transistor.

8. The method according to claim 1, further comprising:
    forming a plurality of pads, including the pad, on the dielectric layer and spaced from each other in the closed path.

9. A method for forming an image sensor, comprising:
    forming a first integrated circuit (IC) chip comprising a photodetector and a first transistor that border on a first semiconductor substrate;
    forming a second IC chip comprising a second transistor on a second semiconductor substrate;
    bonding the first and second IC chips together to form a pixel sensor spanning the first and second IC chips, wherein a body of the first transistor is electrically isolated from a body of the second transistor at completion of the bonding;
    performing an etch to form a ring-shaped trench dividing the first semiconductor substrate into an inner segment and an outer segment; and
    forming a conductive pad in the ring-shaped trench, spaced from the inner and outer segments of the first semiconductor substrate;
    wherein errant particles extend from the second semiconductor substrate to the outer segment of the first semiconductor substrate to electrically short the second semiconductor substrate to the outer segment.

10. The method according to claim 9, wherein an anode of the photodetector is electrically coupled to the body of the first transistor.

11. The method according to claim 9, wherein the forming of the first IC chip comprises:
    depositing a dielectric layer fully covering the photodetector;
    depositing a conductive layer overlying the dielectric layer;

performing an additional etch into the conductive layer to form a gate electrode bordering the photodetector, wherein the etch stops at a top of the dielectric layer and the gate electrode partially forms the first transistor; and
    forming an interconnect structure overlying and electrically coupled to the gate electrode, wherein the dielectric layer fully covers the photodetector after forming the interconnect structure.

12. The method according to claim 11, wherein the etch exposes the dielectric layer, which has a thickness at the ring-shaped trench that is the same as a separation between the gate electrode and the first semiconductor substrate.

13. The method according to claim 9, further comprising:
    forming a third IC chip comprising a third transistor on a third semiconductor substrate; and
    bonding the third IC chip to the second IC chip, such that the second IC chip is between the first and third IC chips,
    wherein the bonding of the third IC chip to the second IC chip electrically shorts a body of the third transistor to the body of the second transistor.

14. The method according to claim 9, wherein the second transistor is formed with a gate dielectric thickness less than a gate dielectric thickness of the first transistor.

15. The method according to claim 9, wherein the first transistor is formed with a first gate electrode and a first sidewall spacer on a sidewall of the first gate electrode, wherein the second transistor is formed with a second gate electrode and a second sidewall spacer on a sidewall of the second gate electrode, and wherein a thickness of the first sidewall spacer is greater than a thickness of the second sidewall spacer.

16. A method for forming an image sensor, comprising:
    forming a trench isolation structure extending into a first substrate;
    forming a photodetector in the first substrate;
    forming a transfer transistor on the first substrate, adjacent to the photodetector, wherein the forming of the transfer transistor comprises: depositing a dielectric layer overlying the trench isolation structure and the first substrate; and forming a gate electrode bordering the photodetector over the dielectric layer;
    forming a first interconnect structure overlying and electrically coupled to the transfer transistor;
    forming a reset transistor and a source follower transistor on a second substrate;
    forming a second interconnect structure overlying and electrically coupled to the reset transistor and the source follower transistor;
    electrically coupling the transfer transistor to the reset transistor and the source follower transistor, wherein an anode of the photodetector is electrically isolated from a body of the reset transistor at completion of the electrical coupling;
    performing an etch into the first substrate to form a trench, which has a ring-shaped top geometry exposing the dielectric layer at a periphery of the first substrate; and
    forming a conductive pad contacting the dielectric layer in the trench, wherein the dielectric layer is entirely formed before the gate electrode is formed.

17. The method according to claim 16, further comprising:
    forming a first bond structure overlying and electrically coupled to the first interconnect structure; and
    forming a second bond structure overlying and electrically coupled to the second interconnect structure, wherein the electrical coupling of the transfer transistor to the reset transistor and the source follower transistor comprises bonding the first and second bond structures together.

18. The method according to claim 16, wherein the photodetector, the transfer transistor, the source follower transistor, and the reset transistor form a pixel sensor configured to concurrently receive multiple different transistor-body voltages.

19. The method according to claim 16, wherein the trench extends continuously in a closed path along the periphery of the first substrate.

20. The method according to claim 19, wherein the dielectric layer is continuous across an entire width of the trench, is continuous from the photodetector to a source/drain region of the transfer transistor that is laterally separated from the photodetector by the gate electrode, and has a thickness at the trench that is the same as a separation from the gate electrode of the first substrate.

\* \* \* \* \*